US012168612B2

(12) United States Patent
Lee et al.

(10) Patent No.: US 12,168,612 B2
(45) Date of Patent: Dec. 17, 2024

(54) DOPED TIN OXIDE PARTICLES AND DOPED TIN OXIDE SHELLS FOR CORE-SHELL PARTICLES

(71) Applicants: University of Houston System, Houston, TX (US); National Central University, Taoyuan (TW)

(72) Inventors: T. Randall Lee, Houston, TX (US); Riddhiman Medhi, Houston, TX (US); Sang Ho Lee, Houston, TX (US); Chien-Hung Li, Kaohsiung (TW); Allan J. Jacobson, Houston, TX (US); Tai-Chou Lee, Taoyuan (TW)

(73) Assignees: University of Houston System, Houston, TX (US); National Central University, Taoyuan (TW)

( * ) Notice: Subject to any disclaimer, the term of this patent is extended or adjusted under 35 U.S.C. 154(b) by 659 days.

(21) Appl. No.: 17/425,783

(22) PCT Filed: Jan. 31, 2020

(86) PCT No.: PCT/US2020/016062
§ 371 (c)(1),
(2) Date: Jul. 26, 2021

(87) PCT Pub. No.: WO2020/160380
PCT Pub. Date: Aug. 6, 2020

(65) Prior Publication Data
US 2022/0169525 A1     Jun. 2, 2022

Related U.S. Application Data

(60) Provisional application No. 62/799,432, filed on Jan. 31, 2019.

(51) Int. Cl.
C01G 19/02     (2006.01)
B01J 23/14     (2006.01)
(Continued)

(52) U.S. Cl.
CPC .............. *C01G 19/02* (2013.01); *B01J 23/14* (2013.01); *B01J 23/18* (2013.01); *B01J 23/52* (2013.01);
(Continued)

(58) Field of Classification Search
CPC ... B01J 35/19; B01J 35/39; B01J 23/14; B01J 23/18; B01J 23/52; B01J 37/0213;
(Continued)

(56) References Cited

FOREIGN PATENT DOCUMENTS

CN     101885471 A  * 11/2010  ............... B82B 3/00
EP       1491503 A2  * 12/2004  ............. B82Y 30/00
(Continued)

OTHER PUBLICATIONS

Notification of Transmittal of the International Search Report and The Written Opinion of the International Search Authority—The European Patent Office—mailed May 29, 2020 for PCT/US2020/016062, 17 pages.
(Continued)

*Primary Examiner* — Patricia L. Hailey
(74) *Attorney, Agent, or Firm* — Jackson Walker LLP

(57) ABSTRACT

The present disclosure relates to a strategy to synthesize antimony- and zinc-doped tin oxide particles with tunable band gap characteristics. The methods yield stable and monodispersed particles with great control on uniformity of shape and size. The methods produce undoped and antimony and zinc-doped tin oxide stand-alone and core-shell particles, both nanoparticles and microparticles, as well as antimony and zinc-doped tin oxide shells for coating particles, including plasmonic core particles.

16 Claims, 18 Drawing Sheets

(51) Int. Cl.
| | |
|---|---|
| *B01J 23/18* | (2006.01) |
| *B01J 23/52* | (2006.01) |
| *B01J 35/00* | (2024.01) |
| *B01J 35/39* | (2024.01) |
| *B01J 37/02* | (2006.01) |
| *B01J 37/04* | (2006.01) |
| *B01J 37/08* | (2006.01) |

(52) U.S. Cl.
CPC ............... *B01J 35/19* (2024.01); *B01J 35/39* (2024.01); *B01J 37/0213* (2013.01); *B01J 37/04* (2013.01); *B01J 37/08* (2013.01); *C01P 2002/54* (2013.01); *C01P 2002/72* (2013.01); *C01P 2002/84* (2013.01); *C01P 2002/85* (2013.01); *C01P 2004/03* (2013.01); *C01P 2004/04* (2013.01); *C01P 2004/51* (2013.01); *C01P 2004/64* (2013.01); *C01P 2006/60* (2013.01)

(58) Field of Classification Search
CPC . B01J 37/04; B01J 37/08; C01G 19/02; C01P 2002/54; C01P 2002/72; C01P 2002/84; C01P 2002/85; C01P 2004/03; C01P 2004/04; C01P 2004/51; C01P 2004/64; C01P 2006/60
USPC .................................................. 502/343, 349
See application file for complete search history.

(56) References Cited

FOREIGN PATENT DOCUMENTS

| EP | 2835352 | | 2/2015 | | |
|---|---|---|---|---|---|
| TW | 201518428 A | * | 5/2015 | ............. | C09D 11/02 |
| WO | WO-2015060232 A1 | * | 4/2015 | ............. | C01G 30/00 |

OTHER PUBLICATIONS

Tripathy, et al., "Synthesis and Photocatalytic Property of Metal@SnO2 Core-Shell Structure Nanocomposites", Journal of Nanoscience and Nanotechnology, vol. 11, 2011, pp. 453-457.

Zulfiqar, et al., "Variation in luminescence and bandgap of Zn-doped SnO2 nanoparticles with thermal decomposition", J Mater Sci: Mater Electron, vol. 27, 2016, pp. 9541-9549.

Hu, et al., "Controlled Coating of Antimony-Doped Tin Oxide Nanoparticles on kaolinite particles", Applied Clay Science, vol. 48, 2010, pp. 368-374.

Wang, et al., "Enhanced ethanol sensing properties of Zn-doped SnO2 porous hollow microspheres", Applied Surface Science, vol. 261, 2012, pp. 890-895.

Yu, et al., "Examination of Au/SnO2 core-shell architecture nanoparticle for low temperature gas sensing applications", Sensors and Actuators, vol. 157, 2011, pp. 444-449.

Tripathy, et al., "Synthesis of thermally stable monodispersed Au@SnO2 core-shell structure nanoparticles by a sonochemical technique for detection and degradation of acetaldehyde", Analytical Methods, vol. 5, 2013, pp. 1456-1462.

Li, et al., "In Situ Growth of Hollow Gold-Silver Nanoshells within Porous Silica Offers Tunable Plasmonic Extinctions and Enhanced Colloidal Stability", American Chemical Society Applied Materials & Interfaces, vol. 6, 2014, pp. 19943-19950.

Tripathy, et al., "Ag@SnO2 core-shell structure nanocomposites", Science Direct, Chemical Physics Letters, vol. 442, 2007, pp. 101-104.

Notification of the International Preliminary Report on Patentability mailed Aug. 12, 2021 for PCT/US2020/016062, 9 pages.

* cited by examiner

FIG. 2

Table 1

| Synthesized Particle | Precursor Solution (Amount) | Precursor Dilution by Water | 40 mM Na$_2$Sn$_2$O$_3$ Sol. | Final Temp. | Reaction Time at Final Temp. | Sodium Antimonate Sol.* | Zinc Precursor Stock Sol. | Centrifuge (Speed, Time) |
|---|---|---|---|---|---|---|---|---|
| Au@SnO$_2$ | Au NPs - Route A (150 mL) | - | 5 mL | 60 °C | 7-10 min | - | - | 7000 rpm, 30 min |
| GS-NS@SnO$_2$ | GS-NS (3.5 mL) | 6.5 mL | 0.8 mL | 60 °C | 20 min | - | - | 7000 rpm, 20 min |
| SnO$_2$ NPs | Water (20 mL) | - | 3 mL | 150 °C | 5 h | - | - | 7000 rpm, 30 min |
| Au@ATO | Au NPs - Route B (10 mL) | - | 0.8 mL | 150 °C | 5 h | 5 mL | - | 7000 rpm, 20 min |
| GS-NS@ATO | GS-NS (3.5 mL) | 6.5 mL | 0.8 mL | 150 °C | 5 h | 5 mL | - | 7000 rpm, 20 min |
| ATO NPs | Water (20 mL) | - | 3 mL | 150 °C | 5 h | 10 mL | - | 7000 rpm, 30 min |
| Au@ZTO | Au NPs - Route B (10 mL) | - | 0.8 | 150 °C | 5 h | - | 0.2 mL | 7000 rpm, 20 min |
| GS-NS@ZTO | GS-NS (3.5 mL) | 6.5 mL | 0.8 mL | 150 °C | 5 h | - | 0.2 mL | 7000 rpm, 20 min |
| ZTO NPs | Water (20 mL) | - | 3 mL | 150 °C | 5 h | - | 0.4 mL | 7000 rpm, 30 min |

*0.0496 g and 0.0372 g of NaSbO$_3$·3H$_2$O were used to prepare the sodium antimonate solution for the Au@ATO and GS-NS@ATO, respectively.

FIG. 11

Table 2

| Sample | Relative Atomic Concentration (%) | | | | | |
|---|---|---|---|---|---|---|
| | Ag | Au | Sn | O | Zn | Sb |
| Au@SnO$_2$ | - | 2 | 14 | 84 | - | - |
| Au@ATO | - | 1 | 16 | 82 | - | 1 |
| Au@ZTO | - | 1 | 17 | 78 | 5 | - |
| GS-NS@SnO$_2$ | 2 | 1 | 17 | 80 | - | - |
| GS-NS@ZTO | 1 | 1 | 23 | 73 | - | 3 |
| GS-NS@ATO | 3 | 1 | 15 | 79 | 2 | - |
| ATO | - | - | 16 | 82 | - | 3 |
| ZTO | - | - | 14 | 86 | 1 | - |

DOPED TIN OXIDE PARTICLES AND DOPED TIN OXIDE SHELLS FOR CORE-SHELL PARTICLES

This application claims priority to U.S. Provisional Patent Application Ser. No. 62/799,432, filed Jan. 31, 2019, entitled "Doped Tix Oxide Particles and Doped Tin Oxide Shells for Core-Shell Particles," the entire contents of which are incorporated by reference herein.

This invention was made with government support under FA9550-18-1-0094 Awarded by Air Force Office of Scientific Research. The U.S. Government has certain rights in the invention

BACKGROUND

This disclosure pertains to doped tin oxide materials and methods for preparing the same.

In recent years, heterogeneous metal oxides have been recognized as useful technology for photovoltaics, solar cells, gas sensors, chemical synthesis, chemical degradation in air and water treatment, anti-bacterial applications, UV filters, optoelectronics, self-cleaning transparent coatings, and the like. Semiconductor metal oxides have a band gap in the range between 2 eV and 5 eV. This places them nicely in between conductors and insulators. On moving to the nanoscale, the band gap is widened further compared to bulk material as a result of quantum confinement. Moving to nanoscale sizes also significantly increases the surface-to-volume ratio. This makes them especially very useful for applications in catalysis and sensing. Small changes in the band structure of these materials on the nano scale enables us to exactly tailor their properties to a variety of specifically targeted applications. One way of achieving that is by doping the metal oxide structure with external dopants. Photocatalytic and photovoltaic applications that require specific band gap matching can be activated by using metal oxide nanoparticles with carefully tuned band gaps. Doping can also introduce additional electrons into the conduction band of a metal oxide that can trigger metal-like conductivity.

Tin oxide is one such material that is active under UV light. The photovoltaic and photocatalytic activities of $SnO_2$-based materials have attracted attention due to their carrier properties, chemical stability across a wide range of pH values, and high photo-activity. In addition, tin oxide is unique in its dual ability for electrical conductivity and transparency. This unique combination of characteristics has attracted considerable attention for its various applications such as gas sensors, solar cells, and transistors. In particular, tin oxide is widely used in making thin films for transparent conducting electrodes.

A major drawback for these parent materials as photocatalysts and photoresponsive materials in general is the confinement of their absorbance properties to the UV region, due to their large band gap, thus restricting their optical activity to only 5% of the solar spectrum that reaches the surface of the earth. While functional under UV light, the bulk of the electromagnetic spectrum reaching the surface of the earth falls outside the UV range, which restricts the practical uses of tin oxide-based materials as photocatalysts in solar-based technologies.

SUMMARY

The present disclosure relates generally to undoped and doped tin oxide particles, both nanoparticles and microparticles, and methods for synthesizing the same. Doping the heterogeneous metal oxide structures can reduce the band gap of these metal oxides and extend their absorption into the visible region.

Doping is an effective way to tune the band gap and increase the conductivity of metal oxide semiconductor materials. However, generally it has been seen that doping metal oxide nanoparticles distorts their shape and uniformity. Doped tin oxides have been shown to be very effective materials as thin films, but ready preparation of spherical, monodisperse doped tin oxide stand-alone nanoparticles has eluded researchers until now. The present facile, solution-based method to make stable monodispersed antimony- and zinc-doped tin oxide particles provides a means to disperse these materials in a variety of media and expand their range of applications. The solution-based methods described here can be used to prepare both stand-alone doped tin oxide nanoparticles and microparticles as well as doped tin oxide coated-nanoparticles or microparticles, including such doped tin oxides as the shell in core-shell architectures.

Bulk $SnO_2$ is an n-type semiconductor with a wide band gap ($E_g$=3.6 eV at 300 K), which corresponds to a wavelength of 344 nm. This band gap of tin oxide can be modified by introducing a wide range of dopants leading to marked improvements in the chemical and physical properties. For example, some reported doped tin oxide materials with differently tuned band gaps are indium-tin-oxide (ITO, 3.62-4.03 eV), fluorine-doped tin oxide (FTO, 3.7-3.8 eV), tungsten-doped tin oxide (WTO, 4.05-4.22 eV), antimony-doped tin oxide (ATO 3.1-3.9 eV), and zinc-tin oxide (ZTO, 3.58-3.97 eV).

The most commonly employed doped tin oxide material is ITO; however, the high cost associated with indium oxide has led to a demand for a cost-effective replacement with similar or superior properties. Two alternatives used herein are antimony- and zinc-doped tin oxide. They are thermally and chemically more stable than undoped $SnO_2$. Babar et al. found that ATO films exhibited high mobility and low resistivity down to $1.22 \times 10^{-3}$ Ωcm while maintaining its transparency. Giraldi et al. demonstrated a band gap of 3.8-3.9 eV and an even lower resistivity of $6.5 \times 10^{-3}$ Ωcm using 7 mol % antimony doping. Their ATO thin film showed good ability as a sensor for $NO_x$ species. Studies conducted by Koebel et al. showed that the resistivity decreases upon antimony doping but goes up again upon further increasing the amount of antimony. The lowest resistivity of $5 \times 10^{-3}$ Ωcm was observed for 9 mole % Sb doping. Senguttuvan et al. were also successful in lowering the band gap to as low as 3.1 eV upon antimony doping.

The band gap of ZTO films was also successfully varied between 3.61 and 3.97 eV by Bhat et al. and Vijayalakshmi et al. in their studies. According to studies conducted by Jiang et al., ZTO structures with around 10% zinc doping exhibited the lowest resistivity and highest carrier concentration. Devi Chandra et al. also demonstrated the utility of ZTO films with high mobilities of 7.7 $cm^2/(V\ s)$ in transistors to good effect. Notably, ATO and ZTO have high carrier mobilities, good electrical conductivities, and excellent optical transmittance, making them promising doped tin oxide materials to be studied on the nanoscale.

Tin oxide nanoparticles have been synthesized using a variety of methods including precipitation, thermal decomposition, microwave-assisted, and hydrothermal protocols. However, most of these studies have reported the synthesis of undoped tin oxide nanoparticles. Doped tin oxide nanomaterials have been synthesized and studied almost exclusively as thin films rather than as stand-alone colloidal nanoparticles. Stand-alone colloidal nanoparticles can be dispersed in a variety of media to expand their utility to a wider range of applications. The few reports that exist for doped tin oxide nanoparticles are complex and afford particles that are polydisperse with non-uniform morphologies. Therefore, the present disclosure relates to a facile, surfactant-free one-step solution-based method for making stand-alone, monodisperse, and uniformly spherical colloidal tin oxide as well as antimony- and zinc-doped tin oxide nanoparticles. The ability to tune the band gap of the tin oxide nanoparticles upon doping with zinc and antimony is also demonstrated herein.

Core-shell nanoparticle systems are popular nanoparticle architectures being used in a variety of applications. However, the shells in core-shell nanoparticle systems have been typically either metals, polymers, or silica shells, all of which are conductors or insulators with fixed band gaps.

This disclosure also pertains to the synthesis of doped tin oxide core-shell particles, both core-shell nanoparticles and core-shell microparticles, in addition to the stand-alone doped tin oxide particles. The shell in most core-shell particles consists of either conductors (metals) or insulators (polymers, silica), all of which have fixed band gaps. There are some methods reported for synthesizing semiconductor metal oxide shells, particularly $CeO_2$, $TiO_2$, and $ZrO_2$ shells. However, there are no reports as of now for synthesizing well-controlled and stable doped metal oxide shells with tunable band gaps. The doped tin oxide shells described herein are extremely easy to synthesize using a simple solution-based method and are also markedly more stable than $SiO_2$ shells; moreover, the dielectric properties of $SnO_2$ shells are more readily tunable than $SiO_2$ shells. As such, $SnO_2$ shells can potentially replace $SiO_2$ shells to synthesize new stable tunable semiconductor nanocomposites for various applications.

In this disclosure, doped tin oxide shells on plasmonic metal nanoparticle cores have been synthesized. Plasmonic metal nanoparticles have been typically used to enable better utilization in the visible region of the solar spectrum. Noble metal nanoparticles exhibit strong extinctions in the visible region due to localized surface plasmon resonance (LSPR). Gold nanoparticles (Au NPs) with their extinction in 520-560 nm range, are the most commonly used type of materials for this purpose. However, recently there have been attempts to develop other types of plasmonic metal particles for wider utilization of the solar spectrum. Gold nanorods, nanostars, nanoshells, and nanospheres of larger sizes have shown the ability to extend into the longer visible and near-IR regions. An economically attractive and more stable alternative is to form hollow nanoshell alloys of gold with silver, which afford broad LSPR extinctions using lesser amounts of metals, which lowers the overall cost. In a recent publication, we demonstrated that hollow gold-silver nanoshells (GS-NSs), which are core-shell particles where the core is hollow, can absorb/scatter light in visible and near-IR regions, which increased the rate of photocatalytic activity of zinc indium sulfide (GS-NS@ZIS) composites by 1.6 times, demonstrating the utility and potential of plasmonic enhancement.

Another major drawback of traditional metal oxide photocatalysts is the rapid occurrence of electron-hole recombination. Electrons excited into the conduction band radiatively recombine with holes, thus quenching the targeted reduction reaction. Plasmonic gold nanoparticles have been shown to also reduce electron-hole recombination, thus enhancing the latter's photocatalytic activity. In these instances, the excited electrons transfer from the conduction band of the photocatalyst onto the gold nanoparticles, thereby trapping them and slowing their recombination. It is our general belief that plasmonic cores in the form of gold nanoparticles (Au NPs) or gold-silver nanoshells (GS-NSs) and the like embedded within a semiconductor photocatalyst shell should give rise to a similar quenching of electron-hole recombination. Thus, to expand the optical properties of tin oxide nanomaterials to other regions of the solar spectrum and to reduce the electron-hole recombination process in these metal oxides, plasmonic cores in the form of AuNPs and GS-NSs were incorporated into doped and undoped nano-sized tin oxide shell particles.

The methods described herein are easy and effective and can be used to coat doped metal oxide shells on different types of particle cores. This paves the way for a change from traditional silica shells to doped tin oxide shells, tin oxide being a better dielectric, markedly more stable while also offering the opportunity to tailor the band gap according to desired specifications.

BRIEF DESCRIPTION OF THE DRAWINGS

FIG. 2 shows Table 1, with reaction parameters for the synthesis of NPs and nanoshells labeled as Au@$SnO_2$, Au@ATO, Au@ZTO, GS-NS@$SnO_2$, GS-NS@ATO, GS-NS@ZTO, $SnO_2$, ATO and ZTO NPs.

FIG. 11 shows Table 2, with relative atomic concentrations derived from XPS measurements.

DETAILED DESCRIPTION OF PREFERRED EMBODIMENTS

Figure 1:
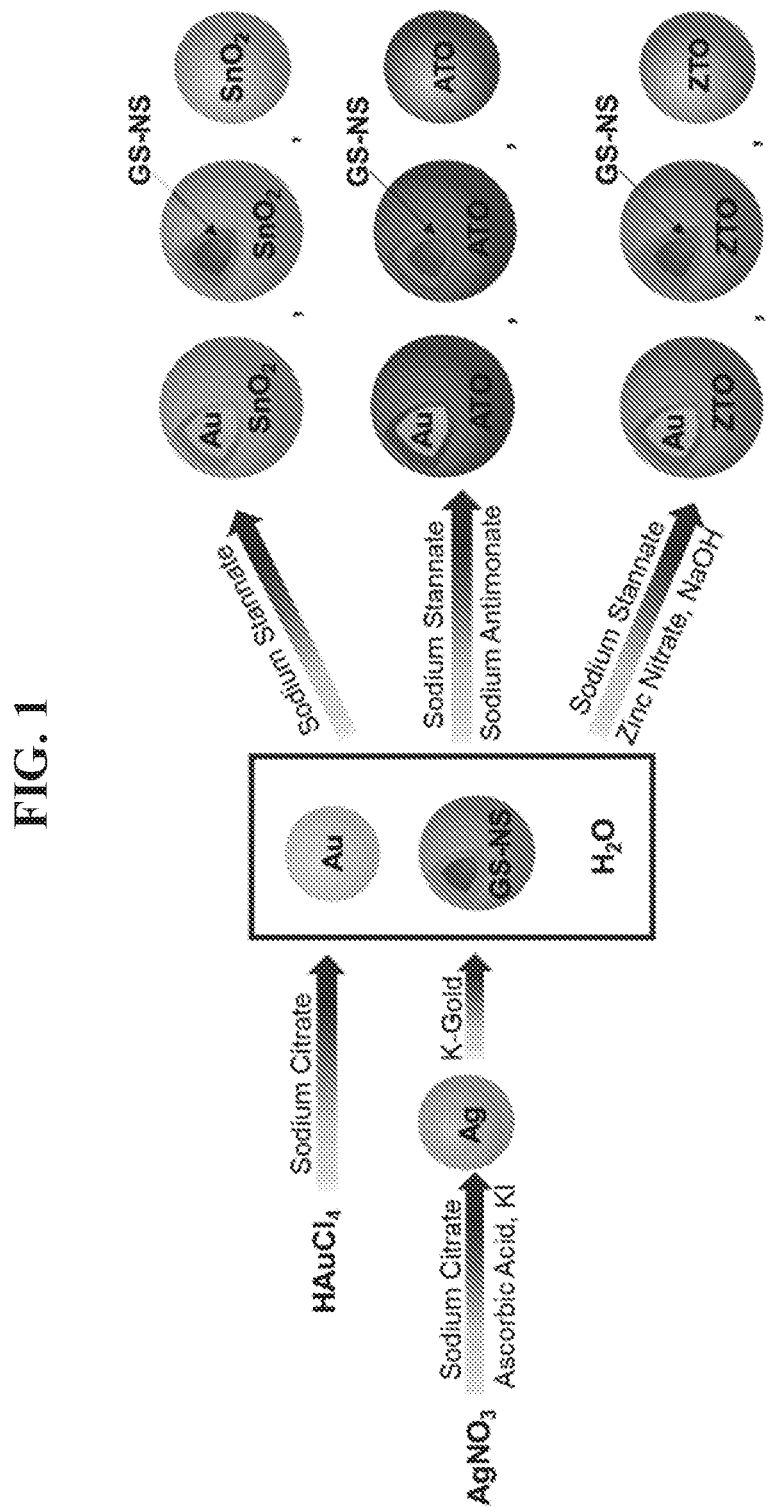
FIG. 1 shows Scheme 1, a general schematic of a synthesis route for $SnO_2$-Coated, ATO-Coated, and ZTO-Coated Au NPs and GS-NSs and $SnO_2$, ATO, and ZTO NPs in accordance with preferred embodiments described herein.

The present disclosure relates to stable, spherical, monodispersed, undoped, and antimony- and zinc-doped tin oxide stand-alone and core-shell particles, as well as antimony- and zinc-doped tin oxide shells surrounding plasmonic metal particle cores, with a tunable band gap.

The present disclosed methods are useful for the preparation of doped tin oxide stand alone and core-shell nanoparticles and microparticles. As used herein, the term "nanoparticles" refers to particles having a diameter or a critical dimension of less than 500 nm. The term microparticles refers to particles having a diameter or a critical dimension of greater than or equal to 500 nm and up to about 500 μm. The nanoparticles and microparticles that serve as core particles and may be coated or otherwise prepared according to the methods described herein may be metal or non-metal, plasmonic or non-plasmonic, and may generally be made up of any suitable material for the desired application. The examples and methods described more specifically herein may be adapted for various sizes of particles and various core particle materials.

This is the first reported method for growing any kind of doped tin oxide-coated particles. Doped tin oxide-coated particles have not been synthesized previously. The doped tin oxide core-shell nanoparticles described in this disclosure combine the properties of tunable wide band gap tin oxide materials with plasmonic metal cores that are tunable across UV, visible, and near-IR wavelengths. This drastically expands their optical response characteristics and broadens the scope of their applications. For the stand-alone doped tin oxide nanoparticles, the methodologies described here are the first to report easy, reliable, stable, and uniform preparation. This enables the ready application of these materials for the controlled fabrication of various devices and systems that can utilize their unique properties.

In preferred embodiments, the present disclosure relates to a strategy to synthesize stand-alone antimony- and zinc-doped tin oxide nanoparticles with tunable band gap characteristics. The methods described herein yield stable and monodispersed particles with great control on uniformity of shape and size. The band gap of the tin oxide nanoparticles (3.89 eV) was successfully tuned upon antimony doping (3.66 eV) and zinc doping (3.85 eV). Other dopants may be used as well, such as indium to give indium in oxide (ITO) shells. In preferred embodiments, these doped nanoparticles with tunable band gap can be deposited onto various substrates to make electrodes, solar cells, multi-layered devices, CMOS electronics; or dispersed into various other media for UV absorption filters, photocatalysis, anti-bacterial applications, air and water treatment. Preferred embodiments also relate to coated plasmonic nanoparticles, especially gold nanoparticles, nanoshells, nanorods, nanostars, and the like, and gold-silver nanoshells with tin oxide and antimony- and zinc-doped tin oxide shells. The plasmonic core-shell nanoparticles exhibit strong extinctions in the UV, visible, and near-IR regions, and the position of the extinction maximum ($\lambda_{max}$) can be tuned within this region. Incorporation of the Au NP and GS-NS core also effectively suppressed electron-hole recombination in the various tin oxide materials. This further establishes the combined effectiveness of doping and plasmonics in expanding the utility of tin oxide nanoparticles, which can be extended to other traditional semiconductor materials. On the whole, the methods described herein allow one to reliably synthesize tailored nanoparticles for targeted applications in catalysis, air and water treatment, solar cells, gas sensors, photovoltaics, optoelectronics, and CMOS technologies.

FIG. 1 shows Scheme 1, a general schematic of a synthesis route for $SnO_2$-Coated, ATO-Coated, and ZTO-Coated Au NPs and GS-NSs and $SnO_2$, ATO, and ZTO NPs in accordance with preferred embodiments described herein.

In preferred embodiments, gold nanoparticles (Au NPs) were synthesized for use in the preparation of $SnO_2$-Coated, ATO-Coated, and ZTO-Coated Au NPs. Any suitable synthesis route for Au NPs may be used. In preferred embodiments, the Au NPs may be synthesized by one of two routes. In Route A, gold nanoparticles were synthesized according to a method previously reported. In a 250-mL round-bottom flask, a solution containing 1% $HAuCl_4$ (0.5 mL) was diluted with $H_2O$ (to 150 mL) and then heated to boiling with stirring. An aliquot of a 1.0 wt % sodium citrate solution (10 mL) was added quickly to the hot $HAuCl_4$ solution. The solution changed color within an hour from light yellow to dark red. In Route B, in a 500-mL beaker, a solution containing 1% $HAuCl_4$ (2 mL) was diluted with $H_2O$ (to 400 mL) and then heated to boiling with stirring. An aliquot of a 1.0 wt % sodium citrate solution (10 mL) was added quickly to the hot $HAuCl_4$ solution and boiled for about 25 min until the color changed from light yellow to dark red. The Au NPs were then used in a precursor solution to be coated with $SnO_2$, ATO, or ZTO, as discussed below.

In preferred embodiments involving the coating of core-shell nanoparticles, or nanoshells, especially hollow gold-silver nanoshells (GS-NSs), silver nanoparticles (Ag NPs) must be synthesized. Any suitable synthesis route for Ag NPs may be used. Preferably, silver nanoparticles can be prepared via modification of the citrate reduction method previously reported. In this preferred embodiment, the first step was to heat 95 mL of water in a 250-mL round-bottom flask to 100° C. A 1-mL aliquot of 5 mM ascorbic acid solution was added to the flask, which was then heated to 120° C. Concurrently, 0.0167 g $AgNO_3$ (0.0100 mmol) was added to 2 mL of water, 2 mL of 1% sodium citrate solution, and 50 μL of 7 μM KI solution in a 50-mL centrifuge tube, which was then sonicated for 10 min. Afterward, the contents of the centrifuge tube were added to the flask followed by refluxing at 120° C. for 1 h. A brownish-yellow colored solution formed, which was consistent with the presence of silver nanoparticles. The solution was allowed to cool to rt and then centrifuged at 8000 rpm for 15 min. After removing the supernatant, the residue was redispersed in 12.5 mL of Milli-Q water.

To prepare the hollow gold-silver nanoshells (GS-NSs), in preferred embodiments, a modified version of a recipe previously reported is preferably used. A basic solution of gold salt (K-gold solution) can be prepared using a method previously reported. Specifically, 0.025 g of potassium carbonate ($K_2CO_3$) was added to 100 mL of Milli-Q water, which was then infused with varying amounts of 1% $HAuCl_4 \cdot xH_2O$ solution under stirring. The mixture (initially yellow in color), became colorless after 30 min of stirring. The flask was then covered with aluminum foil to shield it from light and stored in a refrigerator overnight. A solution of the silver nanoparticles (11 mL), prepared as described above, was then added to 100 mL of the K-gold solution and stirred for ~5 h to yield a blue colored solution. The reaction was monitored by UV-vis spectroscopy, and the reaction was stopped when the extinction peak corresponding to Ag NPs, at ~430 nm, disappeared in the UV-vis spectra. The reaction time dictated the final position of the UV-vis maximum. As such, the reaction can be monitored using UV-Vis spectroscopy and run until the desired maximum is observed. The solution was then centrifuged at 8000 rpm for 15 min. After removing the supernatant, the residue was redispersed in 11 mL of Milli-Q water.

Preferred embodiments herein relate to methods for synthesis of $SnO_2$, ATO, and ZTO nanoparticles (NPs), as well as $SnO_2$-Coated, ATO-Coated, and ZTO-Coated Au NPs and GS-NSs. Reaction parameters for the synthesis of these stand-alone particles and core-shell particles—labeled as $SnO_2$, ATO, and ZTO NPs, and Au@$SnO_2$, Au@ATO, Au@ZTO, GS-NS@$SnO_2$, GS-NS@ATO, GS-NS@ZTO, respectively, are shown in Table 1 in FIG. 2.

Figure 3:
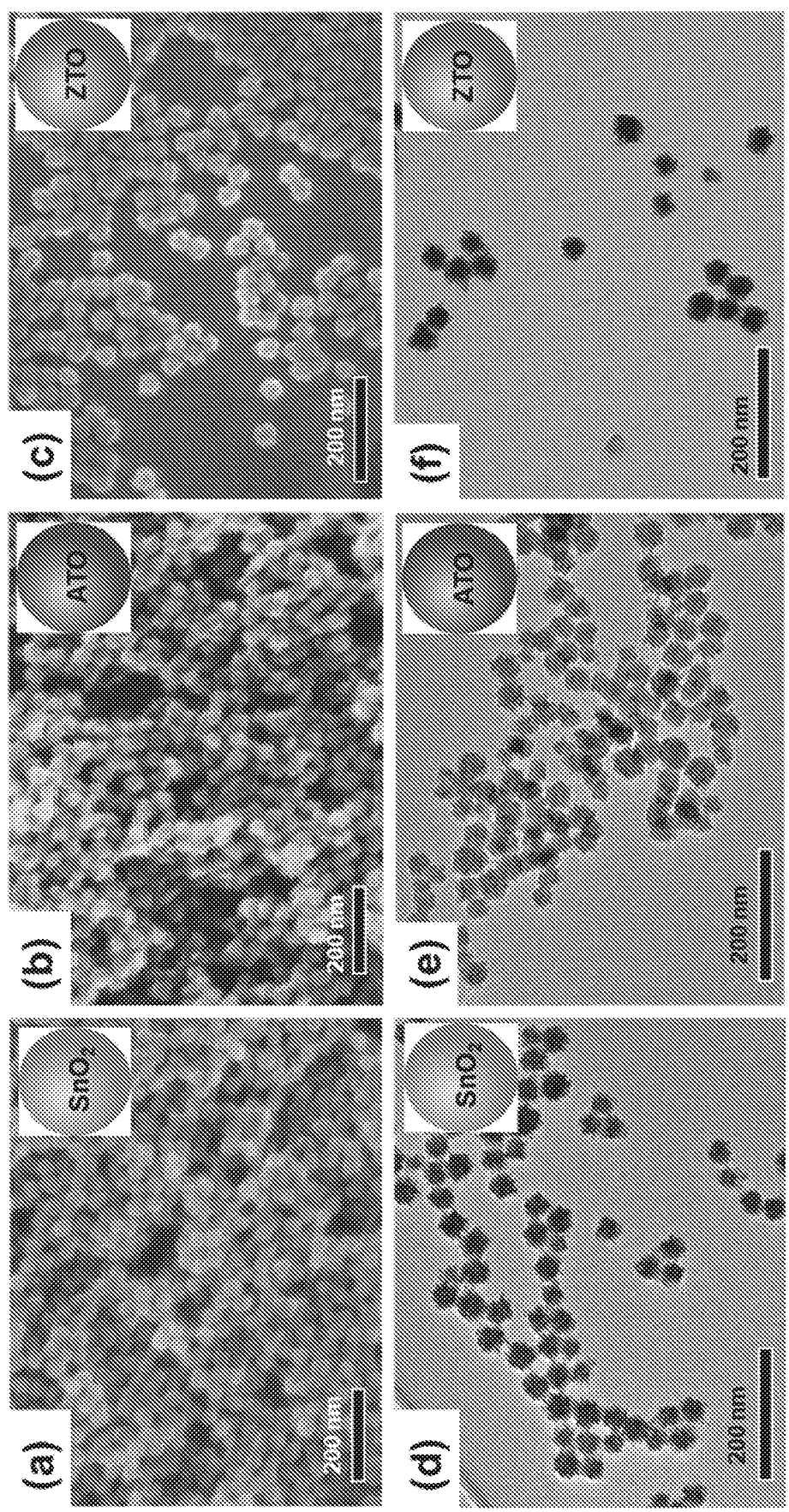
FIG. 3 shows SEM images of (a) $SnO_2$ NPs, (b) ATO NPs, and (c) ZTO NPs and TEM images of (d) $SnO_2$ NPs, (e) ATO NPs, and (f) ZTO NPs.

In preferred embodiments, a one-step hydrothermal method is used to form tin oxide and doped tin oxide nanoparticles, as shown in Scheme 1 in FIG. 1. General preferred synthesis methods for $SnO_2$ NPs and $SnO_2$-coated NPs include the initial selection of a precursor solution—water for $SnO_2$ NPs and Au NPs or GS-NSs for the $SnO_2$-coated NPs. The precursor solution (AuNPs/GS-NSs/water) is heated in a round-bottom flask to at least 60° C. and stirred vigorously, followed by the rapid addition of a 40 mM sodium stannate trihydrate solution. A colorless transparent sodium stannate solution turns white with the formation of $SnO_2$ nanoparticles at temperatures above 57° C.; similarly, temperatures above 60° C. was found to work well for the undoped tin oxide coating recipes reported above. For $SnO_2$ NPs as well, 60° C. is likely the requisite temperature for their formation, but the yield was quite low at this temperature. Therefore, a higher temperature of 150° C. is preferred, as the yield is much better. This $SnO_2$ NP synthesis method is scalable up to 10 times (such as by using a 0.4 M solution of $Na_2SnO_3$ instead of 0.04 M), while the ATO and ZTO recipes are scalable up to 5 times, with little to no effect on homogeneity and shape, with the only difference being an increase in the average size to about 40 nm. Overall, this method proved to be a reliable route for the large-scale synthesis of homogenous spherical tin oxide nanoparticles. All the colloidal particles were collected by centrifugation and washed with deionized water to remove any unreacted species and impurities. FIG. 3 shows (a-c) SEM images and (d-f) TEM images of $SnO_2$, ATO, and ZTO NPs, respectively.

For Au@$SnO_2$, GS-NS@$SnO_2$ NPs, and $SnO_2$ NPs, the mixture is preferably stirred at 60° C. for 7-20 min and then allowed to cool to rt. A purple colloidal solution is obtained in the case of Au NPs, consistent with a $SnO_2$ coating. To achieve a more crystalline state of tin oxide, the mixture may be heated to 150° C. for 5 h under pressure. All the colloidal particles may be collected by centrifugation and washed with deionized water to remove any unreacted species and impurities.

General preferred synthesis methods for ATO NPs and ATO Coated NPs also require the initial selection of a suitable precursor solution—water, Au NPs, or GS-NSs. The precursor solution (AuNPs/GS-NSs/water) as detailed in Table 1 in FIG. 2, was placed in a 75-mL glass pressure vessel and heated to 60° C. Afterward, a 40 mM $Na_2SnO_3$ solution was added, and the contents were stirred for 20 min at 60° C. Concurrently, 0.0372 g of $NaSbO_3 \cdot 3H_2O$ was dissolved in 10 mL of water and was heated to 90° C. to assist in dissolving the antimony compound. The amount of $NaSbO_3 \cdot 3H_2O$ can be varied between 0.0124-0.0496 g to vary the percentage of antimony doping in the tin oxide lattice. It is generally not possible to dissolve amounts higher than those mentioned in 10 mL of water, even at elevated temperatures. Specific amounts of the prepared $NaSbO_3 \cdot 3H_2O$ solution was mixed into the reaction at 60° C. followed by sealing of the glass pressure vessel. Finally, the mixture was heated at 150° C. for an additional 5 h. The solution was then allowed to cool to rt and was centrifuged. The supernatant was removed, and the residue was washed with water once and finally redispersed in Milli-Q water.

General preferred synthesis methods for ZTO NPs and ZTO Coated NPs also require the initial selection of a suitable precursor solution—water, Au NPs, or GS-NSs. The precursor solution (AuNPs/GS-NSs/water) as detailed in Table 1 in FIG. 2, was placed in a 75-mL glass pressure vessel and heated to 60° C. After the solution reached 60° C., specific amounts of a 40 mM $Na_2SnO_3$ solution were added, and the contents were stirred for 20 min. Concurrently, 0.095 g $Zn(NO_3)_2 \cdot 6H_2O$ was dissolved in 5 mL of $H_2O$. This solution was added to 0.5 mL of a 1M NaOH solution to form a white zinc hydroxide, $Zn(OH)_2$, precipitate. In a second step, an excess amount of base in the form of 4.0 mL of a 1M NaOH solution was added to dissolve the $Zn(OH)_2$ precipitate to form a $Na_2ZnO_2$ stock solution. For the third step, a specific amount of this $Na_2ZnO_2$ stock solution was added to the mixture at 60° C., and the glass pressure vessel was resealed. Finally, the mixture was heated at 150° C. for an additional 5 h. The solution was then allowed to cool to rt, and the resulting mixture was centrifuged. The supernatant was removed, and the residue was washed with water once and finally redispersed in Milli-Q water.

For ATO NPs, in preferred embodiments, antimony doping is achieved using sodium antimonate while for the ZTO NPs, zinc doping is achieved using zinc nitrate and sodium hydroxide precursors. With reference to Table 1 in FIGS. 2, 0.0496 g, 0.0372 g, and 0.0496 g of $NaSbO_3 \cdot 3H_2O$ were used to prepare the sodium antimonate solution for the Au@ATO, GS-NS@ATO and ATO NPs, respectively. The pressure induced by the high reaction temperature (~150° C.) in closed vessels also improves the crystallinity of the tin oxide materials. Experiments with stainless steel autoclaves and temperatures of ~150° C. showed that the autoclaves yielded more crystalline tin oxide, ATO and ZTO phases than simple glass round bottom flasks at 60° C. However, upon repeated trials to coat the Au NPs and GS-NSs, a high number of free tin oxide particles were found. It was theorized that difficulties in cleaning the autoclaves was leading to ineffective removal of tin oxide nucleation sites. To address the issue, glass pressure vessels, capable of withstanding temperatures of ~150° C., with Teflon caps are preferably used. Consistent results were found when the glass pressure vessels were used with few tin oxide particles when coating the Au NPs and GS-NSs. The increased yield was attributed to a more effective cleaning of the glassware with aqua regia after each synthesis. Analysis by SEM and TEM showed that even in the absence of any surfactant, the tin oxide nanoparticles were well dispersed, spherical, and uniformly sized, as shown in FIG. 3. The average diameters of the $SnO_2$, ATO and ZTO nanoparticles was 32±3 nm, 31±4 nm, and 39±3 nm respectively, as determined by SEM and TEM image analysis. The low standard deviation observed (<4 nm), signifies the monodisperse size distribution of the synthesized nanoparticles.

Additional preferred embodiments relate to the synthesis of $SnO_2$—, ATO-, and ZTO-coated Au NPs. The strategy used to prepare $SnO_2$-coated (Au@$SnO_2$) and doped $SnO_2$-coated Au NPs (Au@ATO and Au@ZTO) is outlined in Scheme 1 (FIG. 1) and exemplary reaction parameters are in Table 1 in FIG. 2. The first step is to prepare gold nanoparticles (10-15 nm) from chloroauric acid, as discussed. The Au NPs are then coated with a tin oxide shell using an aqueous sodium stannate solution as the preferred precursor. The preferential formation of $SnO_2$ can be achieved from a sodium stannate solution at pH<11, as crystalline $SnO_2$ is the most stable phase at pH values under 11.7, which is a process that can be controlled by optimizing the concentration and temperature of the solution. Notably, the pH of a solution typically decreases with an increase in the temperature, hence this was used to decrease the pH of the sodium stannate solution to yield tin oxide at high temperatures. The pH of the sodium stannate solution drops from ~12.5 down to ~10.5 upon adding to the precursor solution at 60° C. Thus, a pressure vessel and temperatures above 60° C. were used for 20 minutes to achieve the undoped tin oxide coating, shown in FIG. 3. For more crystalline tin oxide phases, a temperature of 150° C. and reaction time of 5 h were utilized. Antimony and zinc doping in the tin oxide shell were achieved separately using a sodium antimonate solution and a sodium zincate solution, respectively, in addition to the sodium stannate solution in a pressure vessel at 150° C. for 5 h. The zinc precursor was prepared from zinc nitrate and sodium hydroxide. Doping was confirmed using XPS, EDX, and XRD and discussed in detail below.

Figure 4:
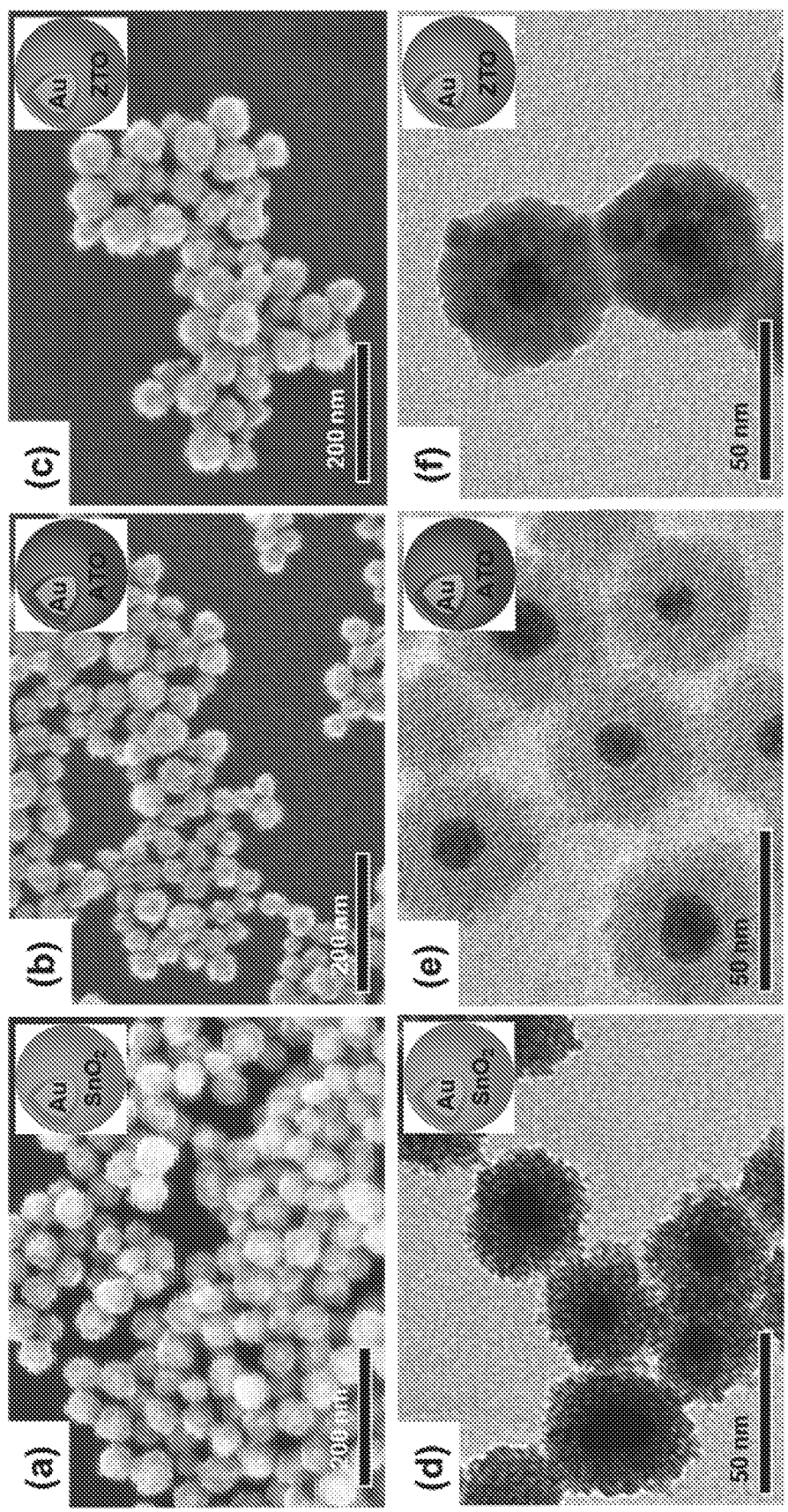
FIG. 4 shows SEM images of (a) Au@$SnO_2$ NPs, (b) Au@ATO NPs, and (c) Au@ZTO NPs and TEM images of (d) Au@$SnO_2$ NPs, (e) Au@ATO NPs, and (f) Au@ZTO NPs.
Figure 5:
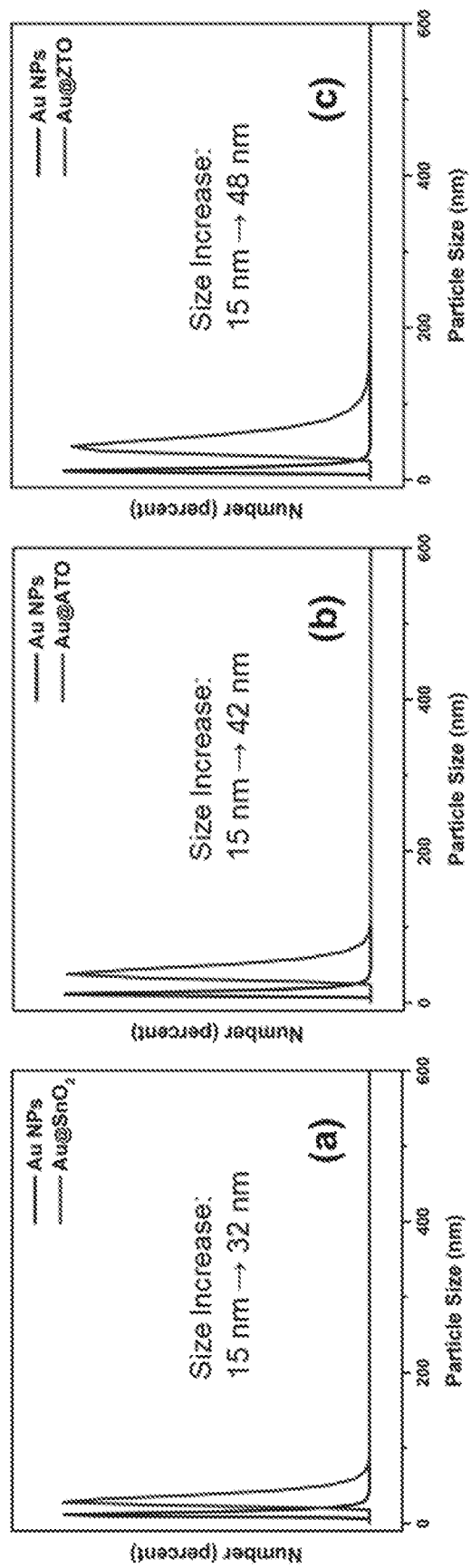
FIG. 5 shows DLS size distribution plots for Au NPs before and after coating with (a) $SnO_2$, (b) ATO, and (c) ZTO shells.

SEM and TEM were used to determine the size and morphology of the nanoparticles. FIG. 4 shows (a-c) SEM images and (d-f) TEM images of Au@$SnO_2$, Au@ATO, and Au@ZTO NPs, respectively. The SEM and TEM images of the tin oxide coated gold nanoparticles shown in FIG. 4 show that they are all covered with a uniform thin tin-oxide shell ~10-20 nm thick. The ATO- and ZTO-coated Au NPs exhibited a similar morphology. Previous studies have found that a $SiO_2$ interlayer thickness of ~17 nm showed the highest photocatalytic activity when silica shells of 0 (no shell), 17, and 42 nm were compared. While direct contact between a zinc indium sulfide photocatalyst (ZIS) and the GS-NSs inside quells the electron-hole separation, a thin shell is desirable if it is sufficiently thin to act as a dielectric medium between the plasmonic nanoparticle and the ZIS photocatalyst while at the same time sufficiently thick to prevent the transfer of hot electrons to the ZIS photocatalyst. The context of these findings was used as a motivation for the synthesis of thin $SnO_2$, ATO, and ZTO shells. Dynamic light scattering (DLS) measurements were conducted to quantify the size of the particles and the thickness of the tin oxide shells. FIG. 5 shows DLS size distribution plots for Au NPs before and after coating with (a) $SnO_2$, (b) ATO, and (c) ZTO shells. The DLS data in FIG. 5 show that the undoped Au@$SnO_2$ nanoparticles had an average diameter of 32±8 nm. According to these measurements, the $SnO_2$ shells have an average thickness of 9±3 nm. The Au@ATO nanoparticles had an average diameter of 42±10 nm, while the Au@ZTO nanoparticles had an average diameter of 48±15 nm. According to these measurements, the ATO shells had an average thickness of 14±5 nm, while the ZTO shells had an average thickness of 17±10 nm. These results are consistent with our observations by SEM and TEM.

Figure 6:
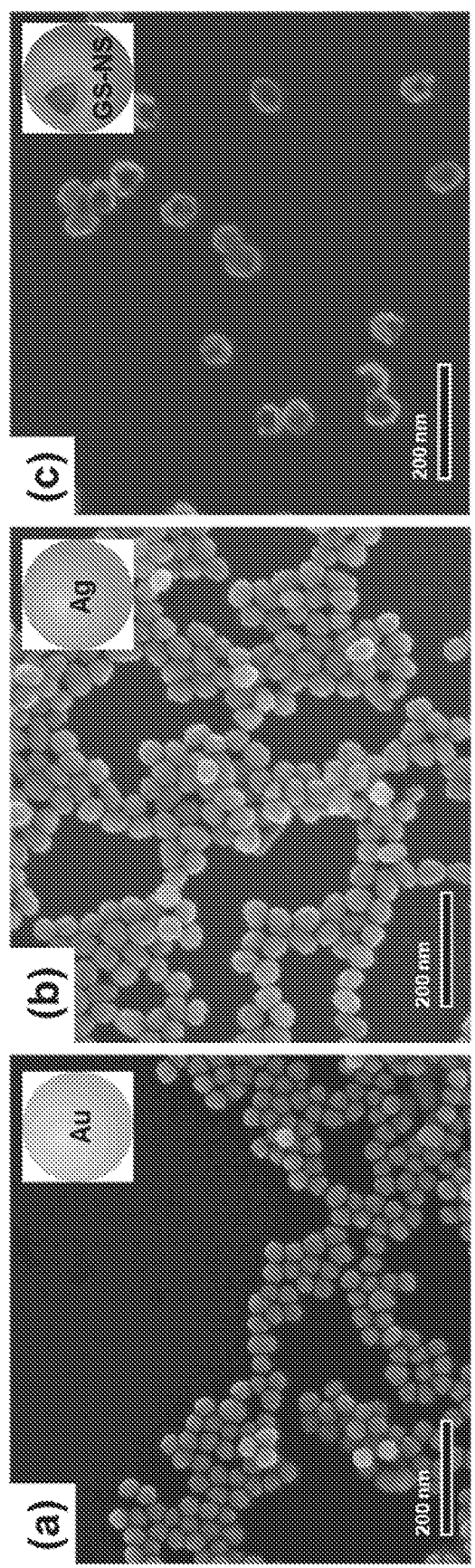
FIG. 6 shows SEM images of (a) Au NPs, (b) Ag NPs, and (c) GS-NSs.

Additional preferred embodiments relate to the synthesis of $SnO_2$—, ATO-, and ZTO-coated GS-NSs. Gold-silver nanoshells can be prepared in two steps as described in Scheme 1 in FIG. 1. First, silver nanoparticles of preferable size ~60-80 nm are prepared from silver nitrate solution. The silver nanoparticles can be prepared following methods previously reported. Next, a K-gold solution is used to perform galvanic replacement to reduce gold onto the silver nanoparticles to produce hollow gold-silver nanoshells. FIG. 6 shows SEM images of (a) Au NPs, (b) Ag NPs, and (c) GS-NSs, respectively. SEM images in FIG. 6 confirm the successful formation of hollow nanoshells. The synthesis procedure used to coat $SnO_2$, ATO, and ZTO shells on the GS-NSs was similar to that for the Au NPs. The modified methods used to make silver nanoparticles and to coat tin oxide, doped and undoped, described herein are highly reproducible.

Figure 7:
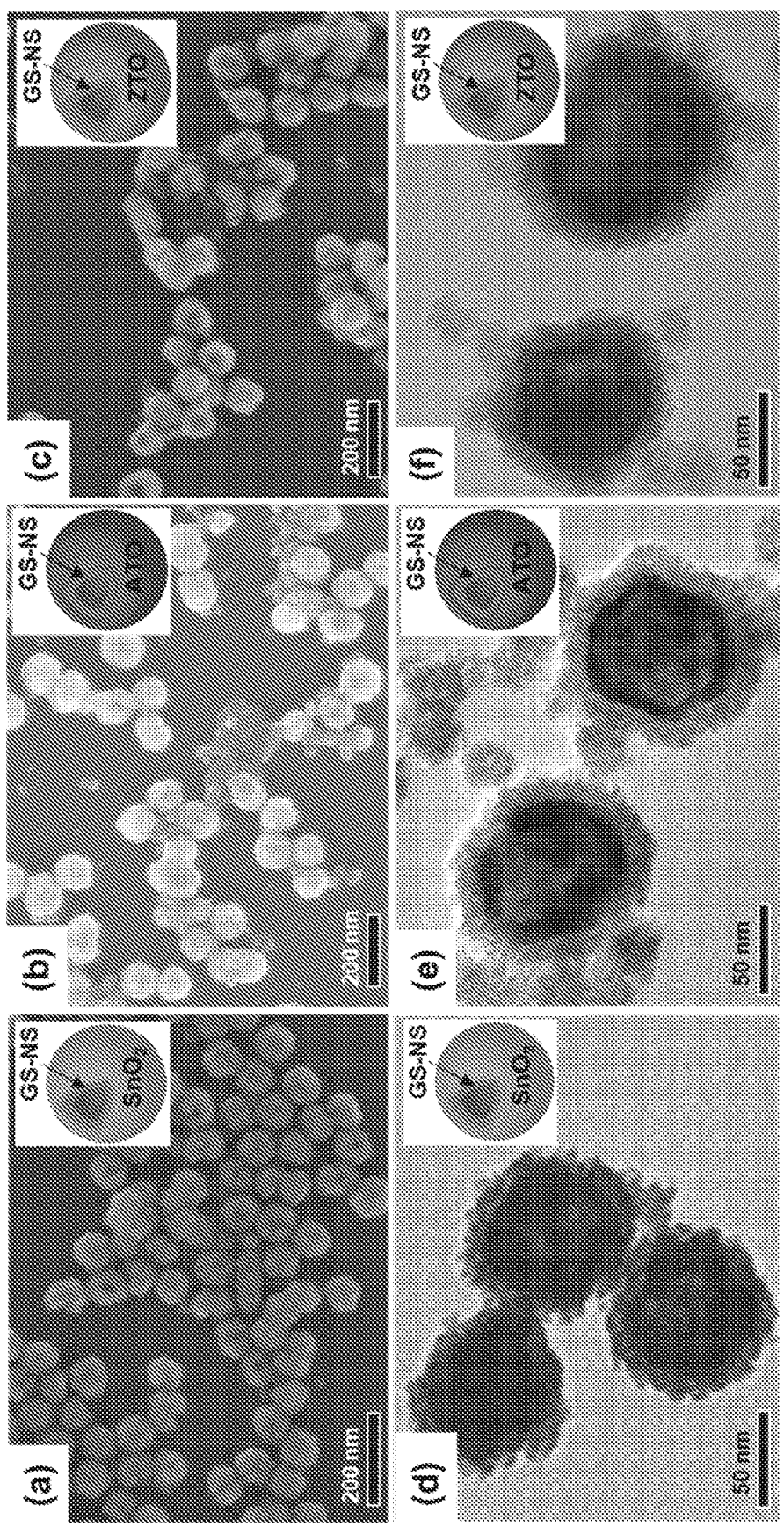
FIG. 7 shows SEM images of (a) GS-NS@$SnO_2$ NPs, (b) GS-NS@ATO NPs, and (c) GS-NS@ZTO NPs and TEM images of (d) GS-NS@$SnO_2$ NPs, (e) GS-NS@ATO NPs, and (f) GS-NS@ZTO NPs.
Figure 8:
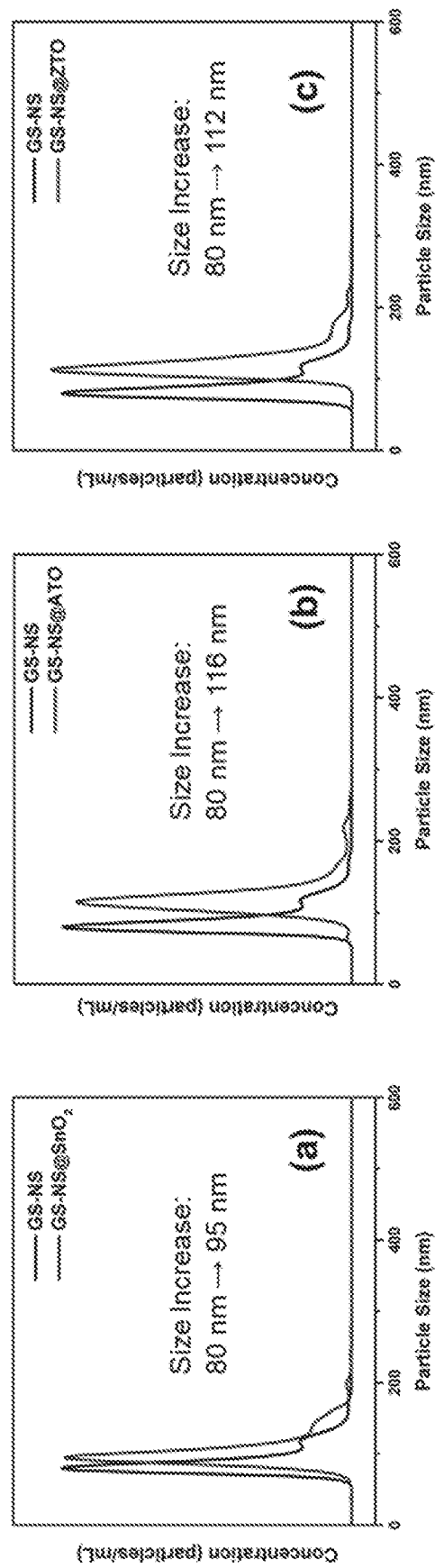
FIG. 8 shows Malvern Nanosight size distribution plots for GS-NSs before and after coating with (a) $SnO_2$, (b) ATO, and (c) ZTO shells.

FIG. 7 shows (a-c) SEM images and (d-f) TEM images of GS-NS@$SnO_2$, GS-NS@ATO and GS-NS@ZTO NPs respectively. The SEM and TEM images of the $SnO_2$-coated GS-NSs in FIG. 7 show that they are all covered with a thin uniform tin oxide shell with thickness of around 10-20 nm. The particles coated with ATO and ZTO also exhibited a similar morphology along with some free tin oxide particles. The number of free tin oxide particles can be decreased accordingly by lowering the amount of sodium stannate solution. FIG. 8 shows Malvern Nanosight size distribution plots for GS-NSs before and after coating with (a) $SnO_2$, (b) ATO, and (c) ZTO shells. Size measurements using the Malvern Nanosight found that for the coated gold-silver nanoshells, the undoped $SnO_2$ shells were about 8±5 nm thick on average, with a total average diameter of 95±25 nm for the coated GS-NS@$SnO_2$ nanoparticles. As in the case of Au NP cores described above, the ATO and ZTO shells are slightly thicker in comparison to the undoped shells. The average diameter of GS-NS@ATO nanoparticles was 115±28 nm while the average diameter for the GS-NS@ZTO nanoparticles was 112±25 nm. According to these measurements, the ATO shells had an average thickness of 18±8 nm in the GS-NS@ATO nanoparticles. On the other hand, the ZTO shells in the GS-NS@ZTO nanoparticles had an average thickness of 16±5 nm. These size measurements are roughly consistent with the thicknesses observed in the SEM and TEM images.

Example 1. Composition and Structural Analysis

Silver nitrate, potassium iodide, ascorbic acid, sodium stannate trihydrate and zinc nitrate were purchased from Sigma-Aldrich and used without further purification. Hydrogen tetrachloroaurate(III) hydrate (Strem), trisodium citrate (EM Science), potassium carbonate (J. T. Baker), sodium antimonate trihydrate (Alfa Aesar), and sodium hydroxide (Flinn Scientific Inc.) were purchased from the indicated suppliers and used without modification. Water was purified to a resistance of 18 MΩ-cm (Academic Milli-Q Water System, Millipore Corporation). All glassware used during the experiments was cleaned in a base bath followed by piranha solution (3:1 $H_2SO_4$:$H_2O_2$) or aqua regia solution (3:1 HCl: $HNO_3$), and then dried in the oven prior to use.

All of the hybrid nanoparticles were characterized by scanning electron microscopy (SEM), transmission electron microscopy (TEM), dynamic light scattering (DLS), X-ray photoelectron spectroscopy (XPS), and X-ray diffraction (XRD). Separately, their optical properties were evaluated by UV-vis spectroscopy, diffuse reflectance spectroscopy (DRS) and photoluminescence spectroscopy (PL).

The NPs were imaged using a scanning electron microscope (SEM, LEO-1525) operating at an accelerating voltage of 15 kV. For high-resolution SEM images, a focused ion beam instrument (FIB; FEI-235) was used. All SEM samples were deposited on a silicon wafer. For improved resolution, the NPs were also evaluated using a JEM-2000 FX transmission electron microscope (TEM) operating at an accelerating voltage of 200 kV. All TEM samples were deposited on 300 mesh holey carbon-coated copper grids and dried overnight before analysis. Energy-dispersive X-ray spectroscopy (EDX) data were collected by an EDX attached to the FIB instrument, providing the elemental composition of the particles. X-ray diffraction (XRD) measurements were obtained using a Siemens, Model D5000 X-ray diffractometer. A concentrated sample of the nanoparticles in water was deposited on a piranha-cleaned glass slide, and XRD data were obtained using Cu K$\alpha$ radiation over the 2$\theta$ range of 20°-100°. The collected XRD data was analyzed using X'PERT PRO PANalytical software. X-ray photoelectron spectroscopy (XPS) data were collected using a PHI 5700 X-ray photoelectron spectrometer equipped with a monochromatic Al K$\alpha$ source with 10 mA emission current and 15 kV emission bias. Concentrated samples of the nanoparticles in water were dropped on copper-tape-covered silicon wafers and dried overnight in a vacuum desiccator. Before sample preparation, the copper-tape-covered slides were washed with Milli-Q Water followed by ethanol several times before being dried with nitrogen gas. UV-Vis extinction spectra were obtained using a Cary 50 Scan UV-vis spectrometer. Diffuse Reflectance Spectroscopy (DRS) was obtained in the powdered solid state using a Carry 5000 UV-Vis NIR spectrometer from Agilent Technologies. Measurements of the particle size (hydrodynamic diameter) were performed using Malvern Zetasizer and Malvern Nanosight instruments. Photoluminescence measurements were carried out using a Perkin-Elmer LS55 fluorometer. Excitation wavelengths of 315 nm and 200 nm with cut-off filters at 390 nm and 430 nm, respectively, were used to ensure complete excitation and minimize noise.

Figure 9:
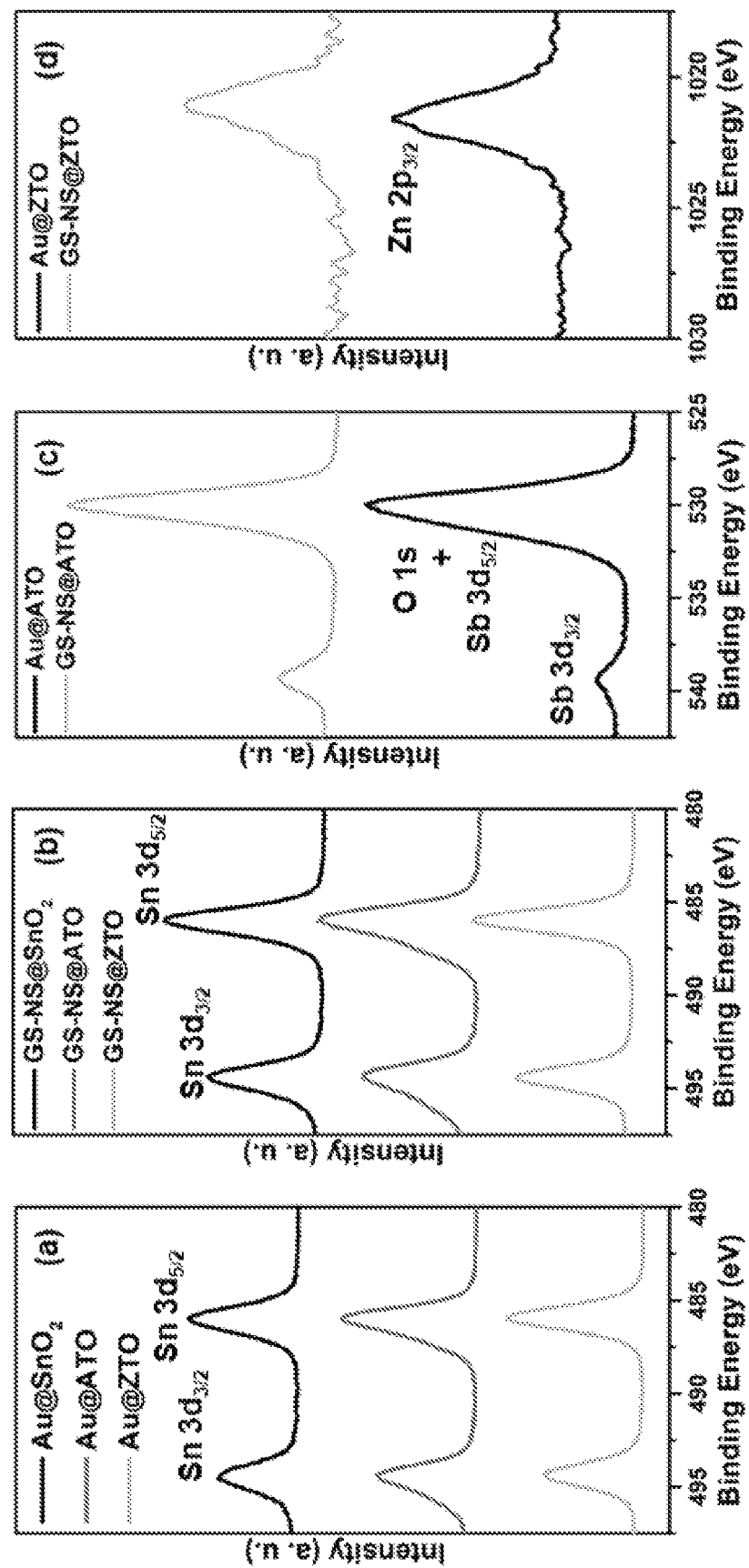
FIG. 9 shows XPS spectra for the (a) Sn 3d region for all coated Au NPs, (b) Sn 3d region spectra for all coated GS-NSs, (c) Sb 3d region for ATO-coated samples, and (d) Zn 2p region for ZTO-coated samples.
Figure 10:
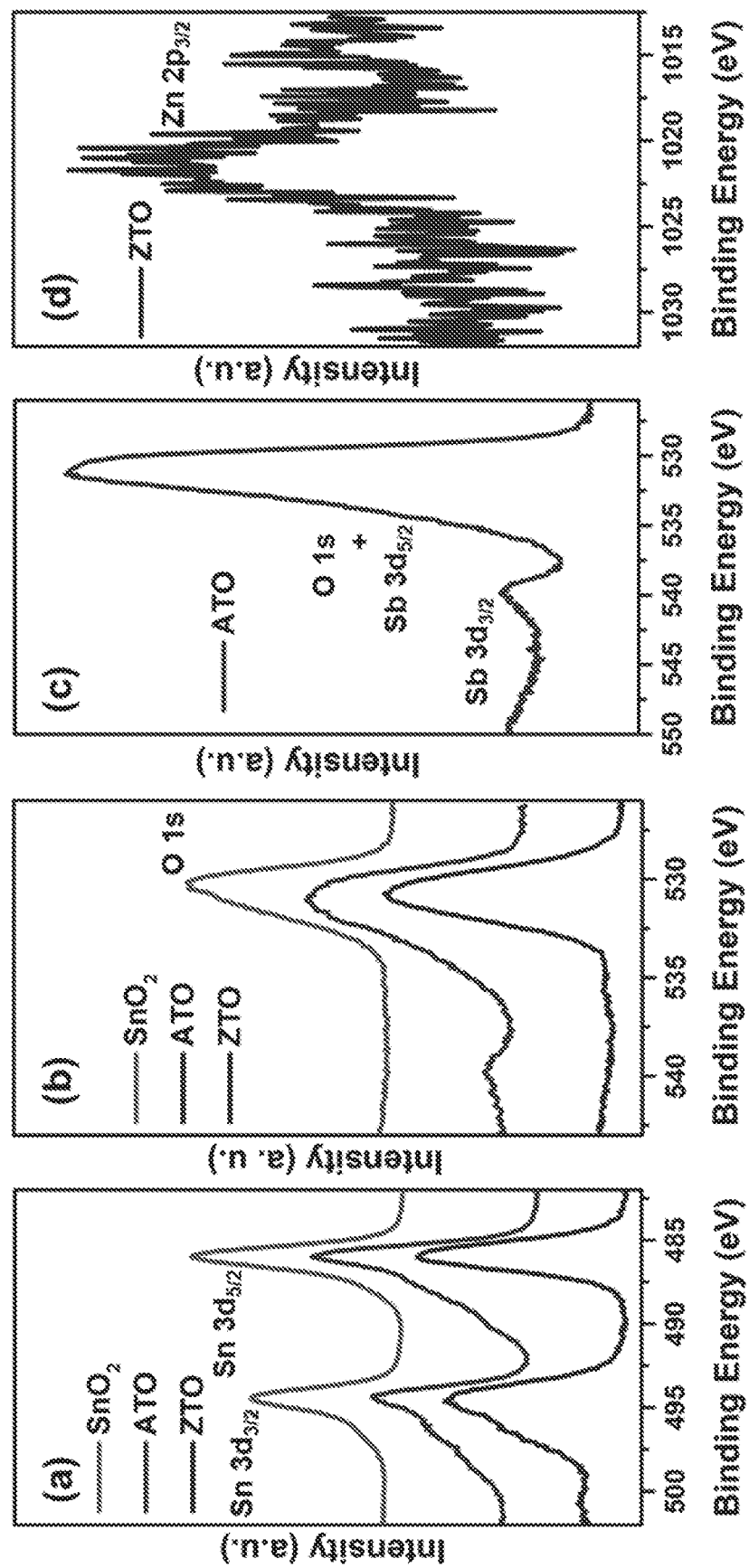
FIG. 10 shows XPS spectra for the (a) Sn 3d region, (b) O 1s region, (c) Sb 3d region, and (d) Zn 2p region for the stand-alone $SnO_2$, ATO and ZTO nanoparticles.

Analysis by XPS was performed to determine the composition of the surface of the particles, shown in FIG. 9 and FIG. 10. FIG. 9 shows XPS spectra for (a) Sn 3d region for all coated Au NPs, (b) Sn 3d region spectra for all coated GS-NSs, (c) Sb 3d region for ATO-coated samples, and (d) Zn 2p region for ZTO-coated samples. XPS spectra for the stand-alone SnO$_2$, ATO, and ZTO NPs are shown in FIG. 10. The oxygen peaks around 530.0 eV are consistent with the presence of a metal oxide, in this case tin oxide. Analysis by XPS showed strong Sn 3d$_{5/2}$ and Sn 3d$_{3/2}$ peaks at 486.0 eV and 494.5 eV, respectively, indicating the presence of the tin oxide coating (FIG. 9(a), 9(b), 10(a)). The relative gold (Au 4f) and silver (Ag 3d) signal intensities were comparatively weak and corresponding atomic concentrations were lower for the coated particles, indicating that these elements were encapsulated by the tin oxide shells. For the ATO coated NPs, the antimony 3$d_{5/2}$ peak overlaps with the oxygen is peak. However, the observation of a significant Sb 3d$_{3/2}$ peak conclusively demonstrated the presence of antimony in the outer shell structure (FIG. 9(c), 10(c)). Relative atomic concentrations calculated from XPS measurements are listed in Table 2 in FIG. 11. Quantitative analysis for Sb was complicated by the presence of the O 1s peak, however using the Sb 3d$_{5/2}$:Sb 3d$_{3/2}$ peak ratio as ~1.5 for antimony, the Sb 3d$_{3/2}$ peak was focused on and the intensity of the Sb 3d$_{5/2}$ peak was calculated according to this ratio. Quantitative analysis revealed that the Sb doping with respect to Sn in the tin oxide lattice was 8% and 12% for the Au@ATO and GS-NS@ATO particles, respectively (Table 2), which is a doping ratio similar to commercially available ATO nanomaterials. Similarly, the ZTO-coated particles exhibited a Zn 2p$_{3/2}$ peak at 1021.0 eV, indicating the presence of Zn$^{2+}$ in the structure (FIG. 9(d), 10(d)). Quantitative analysis of the Sn 3d$_{3/2}$ and Zn 2p$_{3/2}$ peaks revealed that the Zn doping with respect to Sn in the tin oxide lattice was 14% and 8% for the Au@ZTO and GS-NS@ZTO particles, respectively (Table 2). According to studies conducted by Jiang et al., ZTO structures with around 10-12% zinc doping percentage exhibited lowest resistivity and highest carrier concentration. Thus, the 10-12% doping mark is desirable. These doping percentages tend to vary from batch to batch by about ±2%. According to TEM-EDX measurements, the Sb doping percentages were found to be 7% and 13% in the Au@ATO and GS-NS@ATO nanoparticles, respectively. As per the EDX results, the zinc doping percentage was found to be 14% and 9% for the Au@ZTO and GS-NS@ZTO nanoparticles, respectively. The quantitative analysis revealed that the Sb doping with respect to Sn in the tin oxide lattice for the stand-alone ATO NPs was 13% as per XPS and 14% as per EDX measurements, respectively. Quantitative analysis of the Sn 3d$_{3/2}$ and Zn 2p$_{3/2}$ peaks revealed that the Zn doping in the stand-alone ZTO NPs with respect to Sn in the tin oxide lattice was 9% as per XPS and 6% as per EDX measurements, respectively. The dopant concentration is more easily controllable in the case of ATO, and approximately ~3%, ~6%, and ~8% Sb doped ATO nanoparticles were obtained by varying the amount of sodium antimonate salt (0.0124 g, 0.00248 g, and 0.0372 g, respectively). However, increasing the doping percentage above 13-14% could not be achieved due to difficulty with solubility of the sodium antimonate salt. The zinc doping percentage can be controlled with somewhat less precision. We achieved a lower doping percentage of ~4% using 0.2 mL of the zinc precursor solution instead of 0.4 mL, but the 9-14% doping was the highest we have achieved thus far while maintaining a uniform morphology for most ZTO materials. Importantly, the synthesis procedure allows for control of the percentage of Zn and Sb by varying the amount of sodium zincate and sodium antimonite added during the synthesis.

Figure 12:
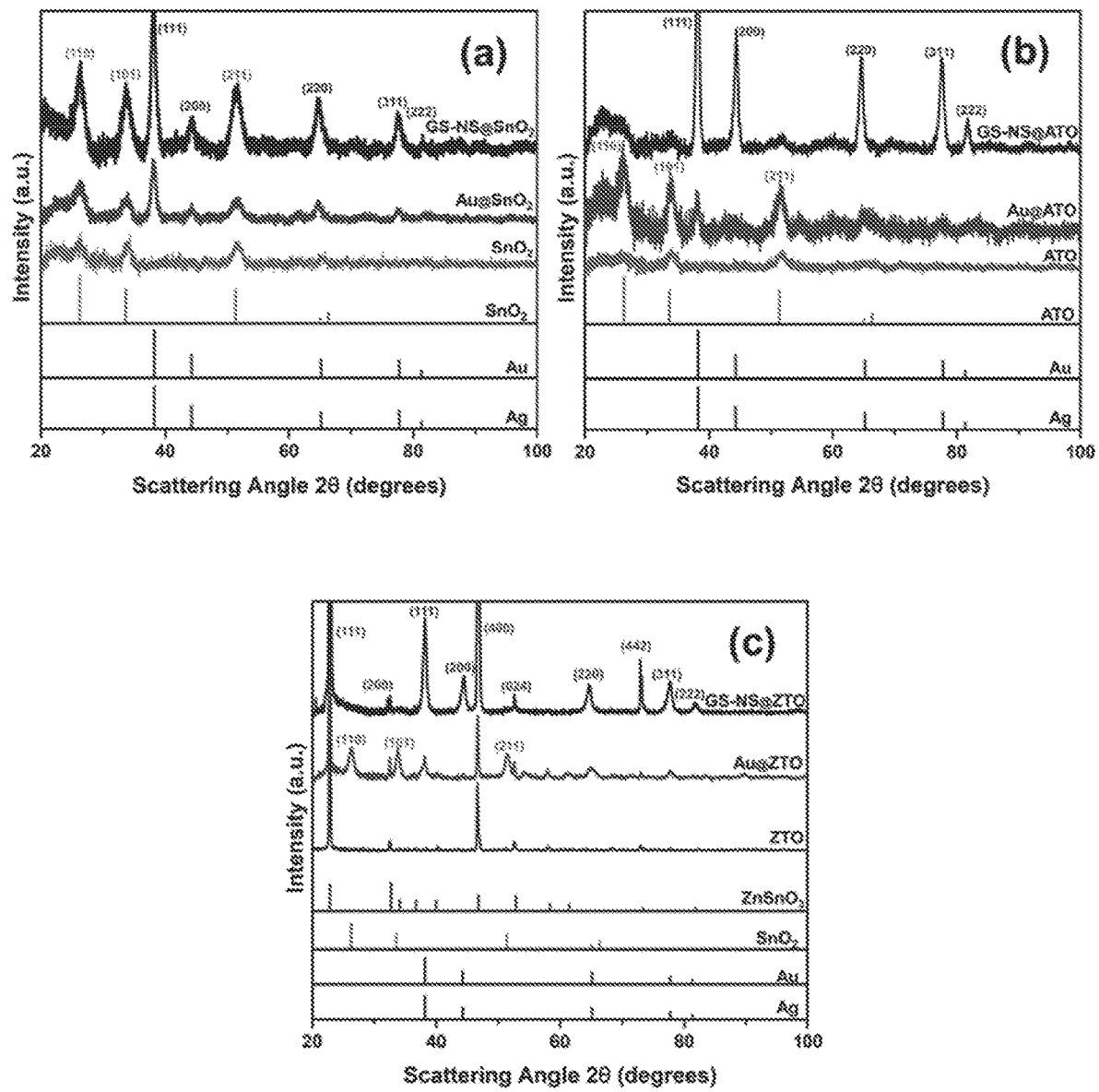
FIG. 12 shows Powder XRD patterns for (a) $SnO_2$ NPs, Au@$SnO_2$, GS-NS@$SnO_2$; (b) ATO NPs, Au@ATO, GS-NS@ATO, and (c) ZTO NPs, Au@ZTO, GS-NS@ZTO with their respective reference line patterns.
Figure 13:
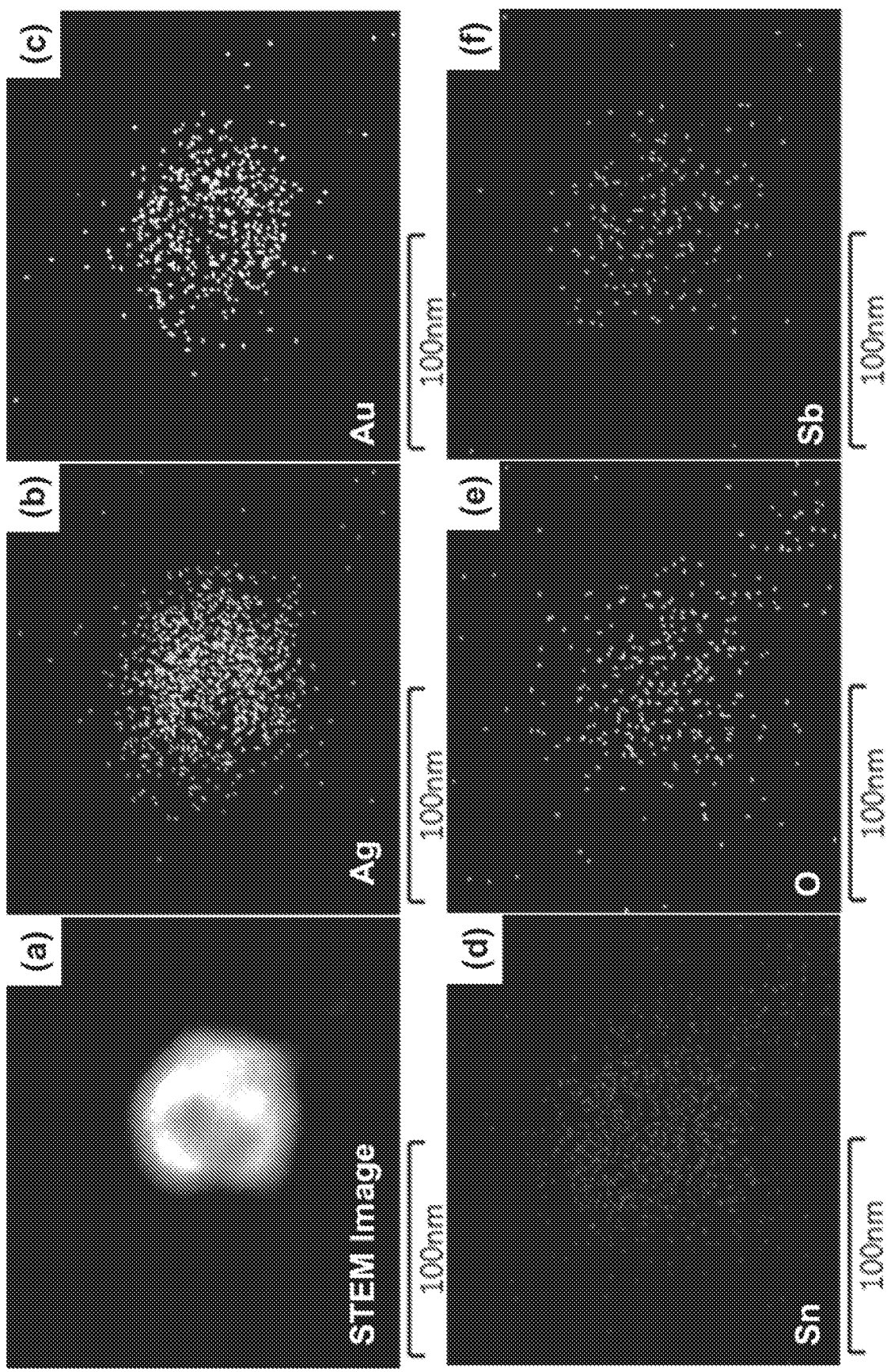
FIG. 13 shows (a) STEM image and TEM-EDS images for the elemental analysis of (b) Ag, (c) Au, (d) Sn, (e) O, and (f) Sb in GS-NS@ATO.
Figure 14:
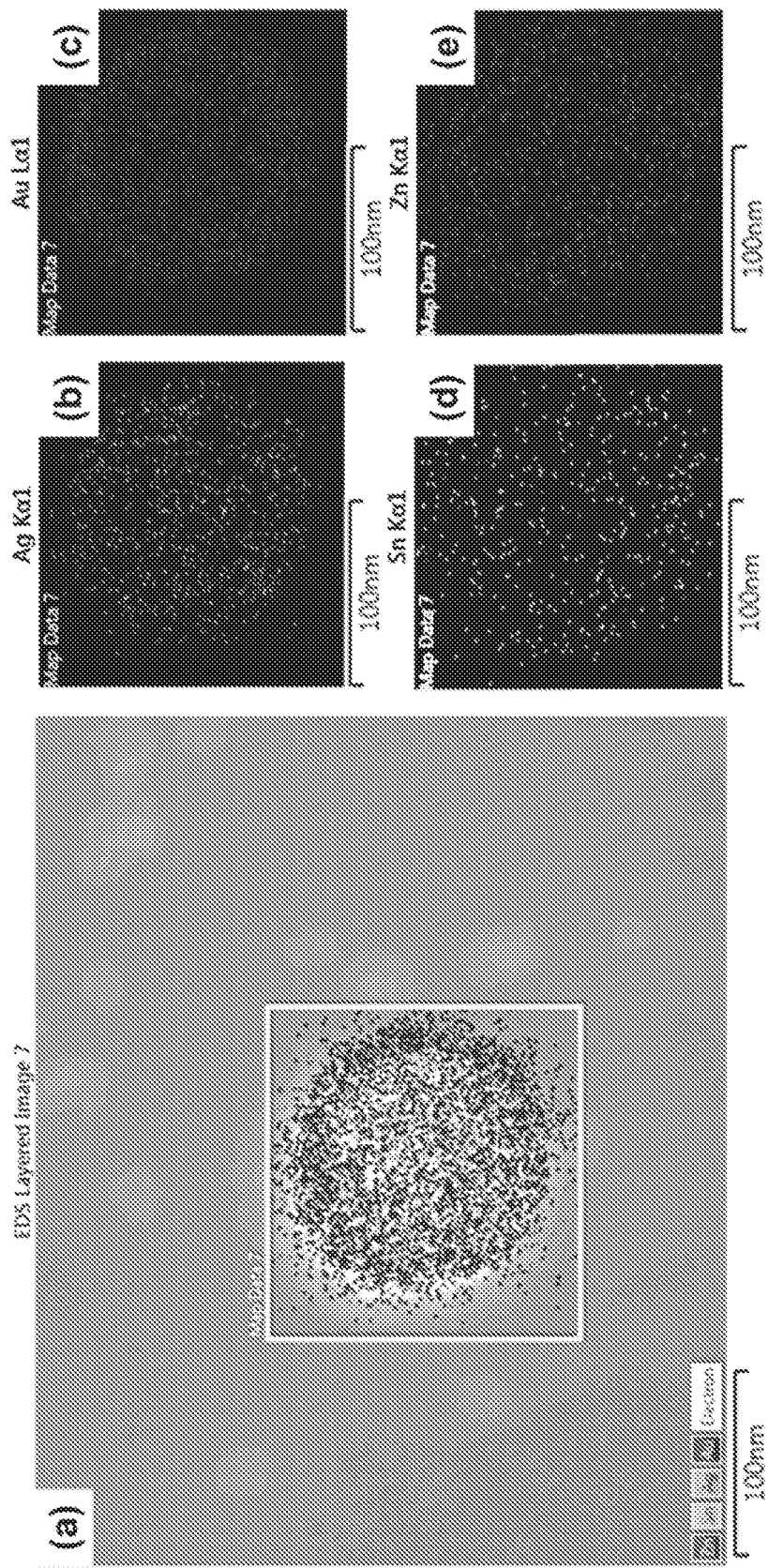
FIG. 14 shows (a) STEM image and TEM-EDS images for the elemental analysis of (b) Ag, (c) Au, (d) Sn, and (e) Zn in GS-NS@ZTO.

Powder XRD patterns were collected to confirm the phases present in the nanoparticles and are shown in FIG. 12. FIG. 12 shows Powder XRD patterns for (a) SnO$_2$ NPs, Au@SnO$_2$, GS-NS@SnO$_2$; (b) ATO NPs, Au@ATO, GS-NS@ATO, and (c) ZTO NPs, Au@ZTO, GS-NS@ZTO with their respective reference line patterns. The XRD spectra of the Au@SnO$_2$ nanoparticles confirm the presence of both gold face-centered cubic (JCPDS 04-0784) and tin oxide rutile (JCPDS 77-0451) phases. For the GS-NSs, gold and silver crystallize into lattices with similar parameters; consequently, it is easy to perform a galvanic replacement reaction to obtain their alloy. As such, the XRD pattern for the gold-silver nanoshells (and their composite particles) are likely to contain both gold (JCPDS 04-0784) and silver (JCPDS 04-0783) phases that overlap. In FIG. 12, the ATO-coated gold nanoparticles and gold-silver nanoparticles exhibit the expected gold, silver and ATO peaks. Since Sb is doped into the tin oxide structure, the XRD peak pattern is not very different from the pattern of the undoped SnO$_2$, which is consistent with the literature for an ATO phase (JCPDS 21-1251). In contrast, the XRD pattern of the ZTO-coated particles is consistent with the presence of a ZnSnO$_3$ phase (JCPDS 11-0274), which indicates a change in the crystal structure of the tin oxide phase upon doping with zinc, also in accordance with previous literature. Since the antimony-doped and undoped tin oxide XRD patterns are similar, we also performed TEM mapping to examine whether the Sb is distributed throughout the SnO$_2$ lattice. FIG. 13 shows (a) STEM image and TEM-EDS images for the elemental analysis of (b) Ag, (c) Au, (d) Sn, (e) O, and (f) Sb in GS-NS@ATO. The TEM mapping shows that the antimony is distributed evenly throughout the tin oxide shell. In combination with the XRD pattern and TEM mapping, we can conclude that the antimony is doped into the tin oxide lattice with only tin oxide, gold, and silver present and no other possible antimony species. FIG. 14 shows (a) STEM image and TEM-EDS images for the elemental analysis of (b) Ag, (c) Au, (d) Sn, (e) Zn in GS-NS@ZTO. The TEM mapping shows that the antimony and zinc are distributed evenly throughout the tin oxide shell. Crystallite size calculations were performed using the Scherrer equation based on the XRD data. The crystallite size for the ZTO phases were calculated to be 36-50 nm, while the crystallite sizes for the SnO$_2$ and ATO nanoparticles were calculated to be within 7-10 nm and 6-9 nm, respectively. This demonstrates the ability to increase crystallinity with zinc doping while arresting grain growth in SnO$_2$ and ATO structures.

Figure 15:
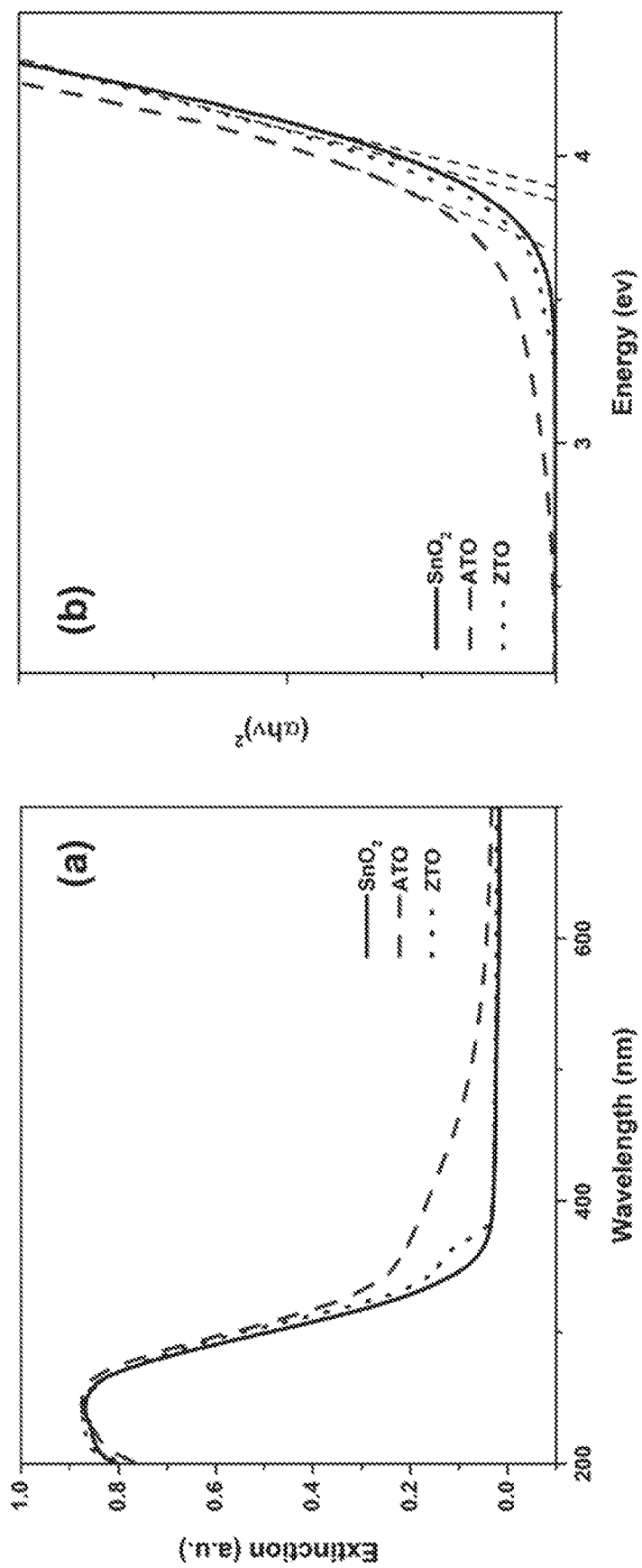
FIG. 15 shows (a) Solid-state DRS spectra and (b) Tuac plot of $SnO_2$, ATO, ZTO NPs.

Diffuse Reflectance Spectroscopy (DRS) measurements were conducted to determine the optical band gap of the tin oxide materials. The nanoparticle solution was centrifuged, and dried and DRS data was collected in the solid state. FIG. 15 shows (a) Solid state DRS spectra and (b) Tuac plot of SnO$_2$, ATO, ZTO NPs. As seen from FIG. 15(a), SnO$_2$ NPs show a very characteristic spectrum, which is well consistent with previous literature. The relation between the absorption coefficients ($\alpha$) and the incident photon energy (hv) by using the Tauc's equation was used to calculate the optical band gap (E$_g$). The plots of $(\alpha hv)^{1/r}$ (taking r=½ for direct band gap semiconductor) versus photon energy (hv) are shown in FIG. 15(b). The optical band gap of SnO$_2$ NPs was found to be 3.89 eV which is larger than the band gap of bulk SnO$_2$, as expected from the quantum confinement effect. Doping a metal oxide structure generally reduces the band gap due to the introduction of either donor or acceptor levels into the original band gap. A significant narrowing of the band gap and an enhancement in the visible absorption are observed upon antimony doping. The DRS absorption spectrum and Tauc plots suggest band bending upon antimony doping, decreasing the band gap down to 3.66 eV. The band edge shifts to a slightly higher wavelength and in addition to that, there is a wide absorption tail going all the way to 700 nm. The ATO NPs also visibly look a little colored, compared to SnO$_2$ and ZTO NPs which look completely white. Upon doping with zinc, a slight shift in the band edge to a higher wavelength region is observed as the band gap decreases to 3.85 eV. This shift is not as significant as that observed upon antimony doping. This is perhaps due to the restructuring of the crystal lattice triggered upon zinc doping, as seen earlier from XRD measurements. However, it must be noted that this restructuring of the crystal lattice affords very crystalline ZTO phases with long range order, which should enhance other properties like electrical conductivity. This demonstrates that the band gap of the tin oxide materials can be successfully tuned upon antimony- and zinc-doping.

Figure 16:
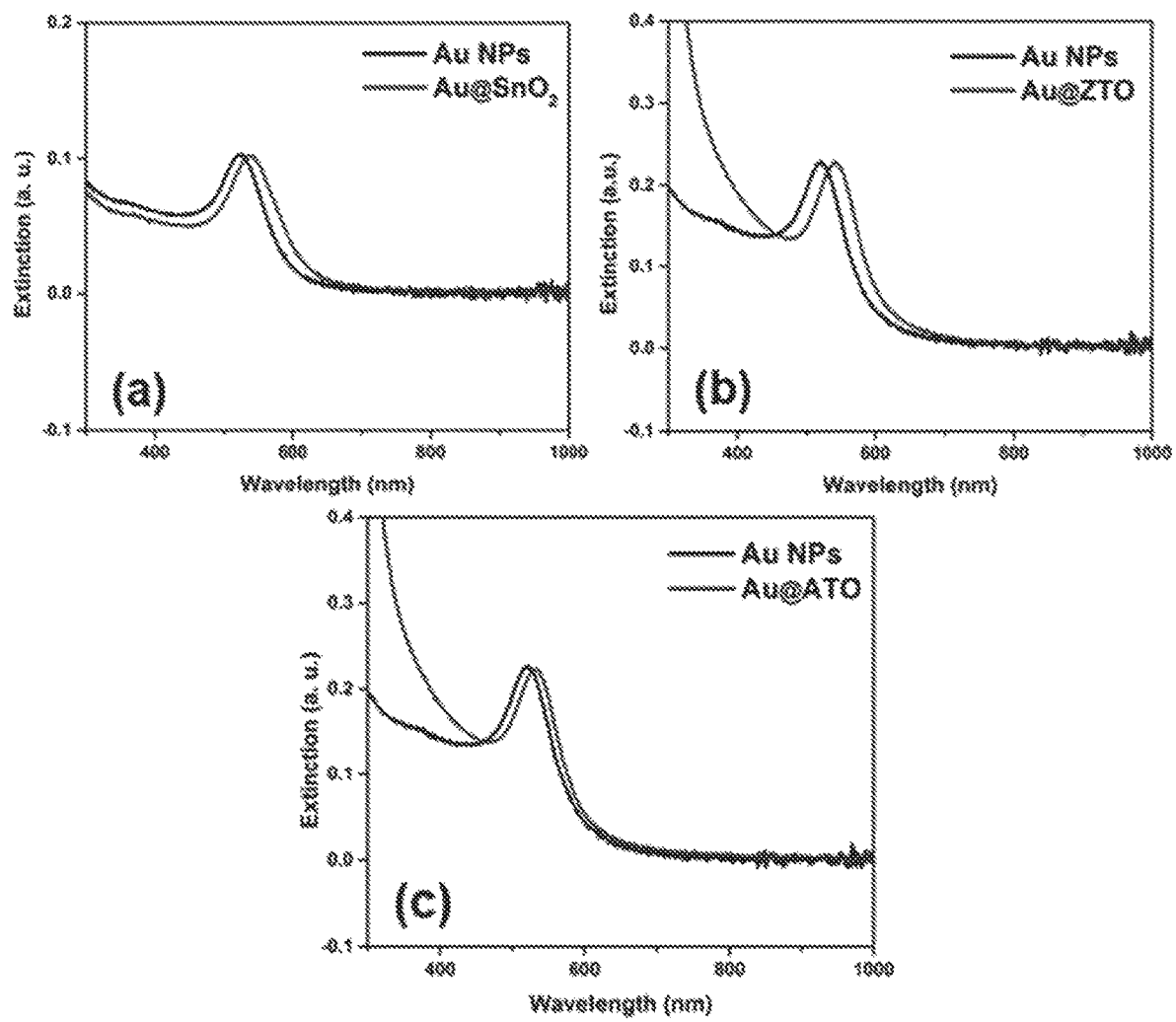
FIG. 16 shows extinction spectra of Au NPs before and after coating with (a) $SnO_2$, (b) ATO, and (c) ZTO shells, respectively.

UV-vis spectroscopy was used to evaluate the optical extinction properties of the nanoparticles. In previous studies, gold nanoparticles and gold-silver nanoshells have typically exhibited strong activity in the visible and near-IR region due to localized surface plasmonic resonance. Localized surface plasmonic resonance (LSPR) is a unique property exhibited by metal nanoparticles and nanoshells where surface electrons couple with the incident light and oscillate in the same frequency, leading to unusual extinction observed in the visible region. FIG. 16 shows (a-c) Extinction spectra of Au NPs before and after coating with SnO$_2$, ATO, and ZTO shells, respectively. As shown in FIG. 16, the gold nanoparticles exhibited an SPR extinction maximum at ~520 nm, which matched well with their measured size. The tin oxide coatings, doped and undoped, resulted in a red shift of the SPR peak of ~20-40 nm. This red shift is consistent with previous observations of high refractive index coating materials on nanoparticles; notably, the refractive index of SnO$_2$ (~2.006) is greater than that of water (~1.333).

Figure 17:
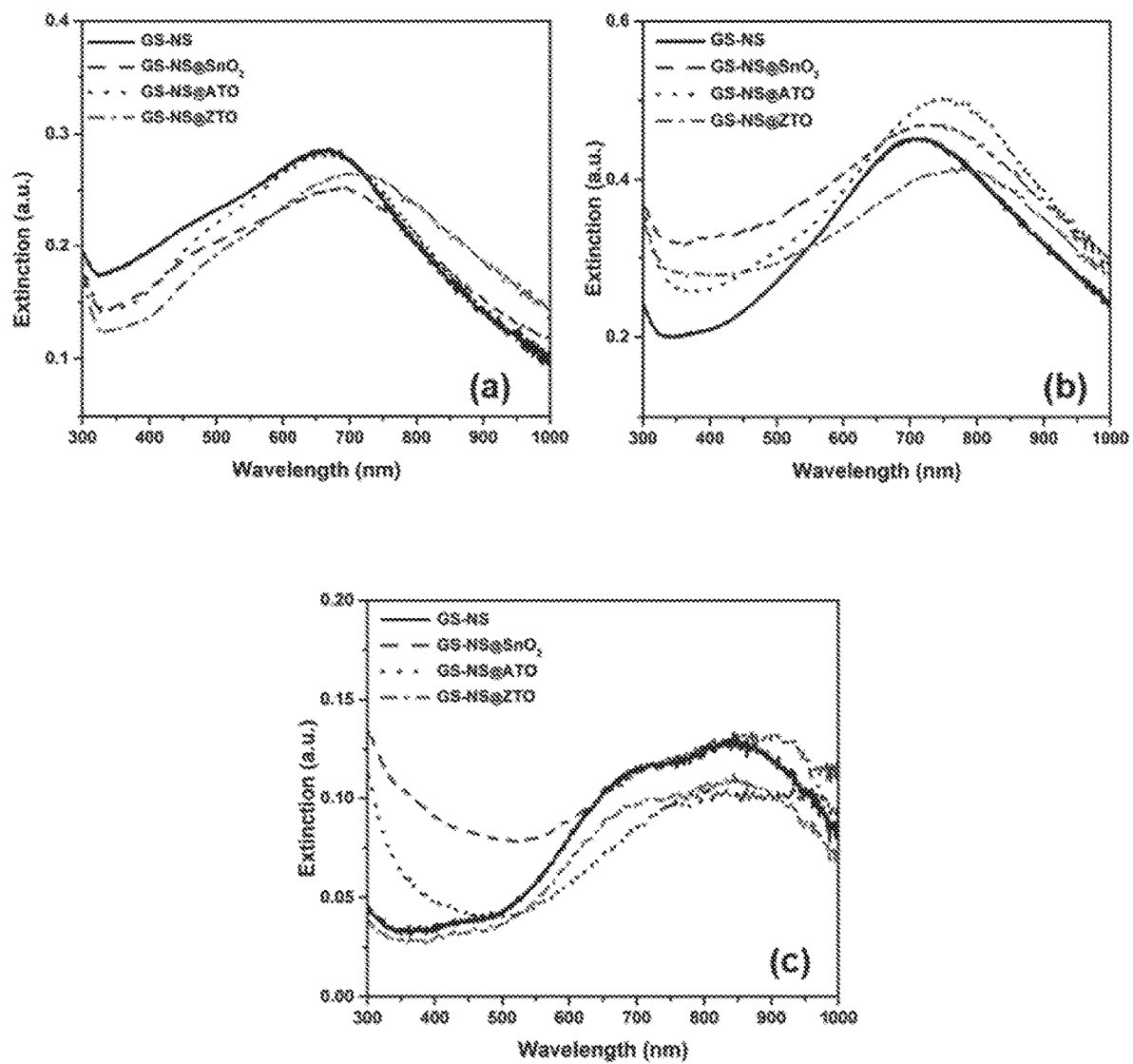
FIG. 17 shows extinction spectra for GS-NSs with different absorption maximum ($\lambda_{max}$) before and after coating with (a) $SnO_2$, (b) ATO, and (c) ZTO shells.

Extinction spectra for the GS-NSs is presented in FIG. 17 (a-c) with different absorption maximum ($\lambda_{max}$) before and after coating with SnO$_2$, ATO, and ZTO shells. The advantage of using GS-NSs is that the surface plasmon resonance bands can be tuned. Three different types of GS-NSs were synthesized with SPR extinction bands centered around 680 nm, 750 nm, and 840 nm. The SPR wavelength was adjusted by varying the amount of HAuCl$_4$ in the K-gold solution and also by adjusting the reaction time for the galvanic replacement step. Higher concentration of gold precursor and longer reaction times during this galvanic replacement reaction lead to thinner nanoshells with a higher Au/Ag compositional ratio resulting in longer SPR extinction wavelengths. The broad extinction of the GS-NSs in the visible and near-IR regions and the tunability of the absorption are advantageous features that renders their incorporation into the design attractive. Effectively, the extinction maximum can be shifted from ~500 nm to beyond the 1000 nm mark enabling better utilization of the solar spectrum by the different tin oxide materials. Similar to the Au NPs, a red shift upon coating with tin oxide was also apparent in the GS-NSs, due to change in surrounding refractive index, vide supra. Importantly, the combination of Au NPs or GS-NSs into the tin oxide-based materials allow for the absorption/scattering of light in the visible to near-IR region.

Figure 18:
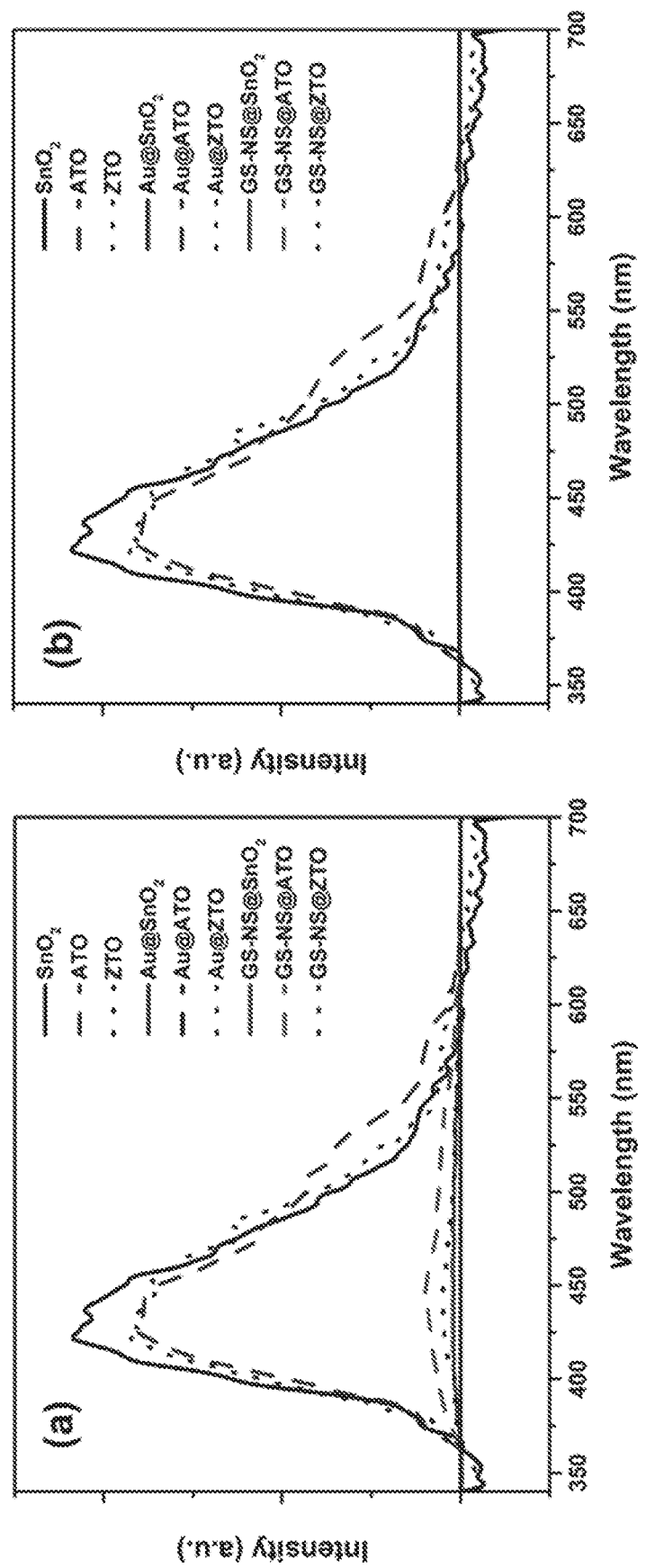
FIG. 18 shows photoluminescence spectra of $SnO_2$, ATO, ZTO, Au@$SnO_2$, Au@ATO, Au@ZTO, GS-NS@$SnO_2$, GS-NS@ATO and GS-NS@ZTO NPs normalized with respect to (a) particle concentration and (b) particle concentration+volume of tin oxide material.

To examine the effect of the GS-NS core in quenching the electron hole recombination in the tin oxide-based materials photoluminescence studies were conducted. Photoluminescence measurements were first carried out for all the samples with an excitation wavelength of 315 nm. For the purpose of meaningful comparison, photoluminescence intensities were normalized with respect to particle concentration and volume percent of tin oxide material per particle, as shown in FIG. 18. FIG. 18 shows photoluminescence spectra of SnO$_2$, ATO, ZTO, Au@SnO$_2$, Au@ATO, Au@ZTO, GS-NS@SnO$_2$, GS-NS@ATO and GS-NS@ZTO NPs normalized with respect to particle concentration (a) and particle concentration+volume percentage of tin oxide material (b). It can be seen that the photoluminescence intensity of the SnO$_2$, ATO and ZTO samples decreases significantly with both an Au or GS-NS core inside, implying nearly complete suppression of the electron-hole recombination in SnO$_2$, ATO and ZTO. These observations further strengthen the argument for this core-shell design with the plasmonic nanoparticle as the core and the metal oxide as the shell. There seems to be a slight decrease in PL intensity upon antimony and zinc doping, compared to the undoped SnO$_2$ NPs. However, the effect of Au NP and GS-NS cores were similar on all three types of tin oxide materials studied and any difference between the doped samples are within experimental error.

Au NPs have been typically used to quench electron-hole recombination in $TiO_2$ and $SnO_2$ photocatalysts. Previous studies with gold-decorated $TiO_2$ nanoparticles exhibited effective suppression of electron-hole recombination leading to higher photocatalytic activity. In studies conducted by Khan et al. it was observed that photoelectrodes made of tin oxide nanoparticles exhibited higher anodic and cathodic current under visible light irradiation when decorated with Au. This enhancement seems to have direct correlation to their observation that the Au decoration significantly suppressed electron-hole recombination in the tin oxide nanoparticles. Also, gold-decorated tin oxide nanoparticles showed an approximately fourfold increase in photocatalytic activity as well. Studies showed that the suppression of electron-hole recombination per particle was effective with Au NP cores inside as well. The decrease in the PL intensities per particle are quite similar for all the tin oxide-coated particles for both the Au NP and GS-NS cores. Overall, incorporation of GS-NS cores within tin oxide materials leads to an nearly complete suppression of electron-hole recombination along with a much broader extinction in the visible region. Thus, the GS-NS particles are arguably the most effective cores. A combination of these two factors renders these unique hybrid particles to be incredibly attractive for photocatalytic and photoelectronic applications.

What is claimed is:

1. A method for preparing doped tin oxide material, comprising:
   preparing a precursor solution, wherein the precursor solution consists of water, or wherein the precursor solution comprises core-shell particles, wherein the core-shell particles are core-shell nanoparticles or core-shell microparticles;
   heating the precursor solution to at least 60° C.;
   adding a sodium stannate solution to the precursor solution to form a mixture comprising tin oxide material;
   preparing a doping solution, wherein the doping solution comprises an antimonate salt or a zinc salt;
   adding a specific amount of the doping solution to the mixture comprising tin oxide material to form a reaction mixture;
   heating the reaction mixture to at least 150° C. for a period of time; and
   collecting doped tin oxide material from the reaction mixture, wherein the doped tin oxide material comprises stand-alone tin oxide particles or tin oxide core-shell particles, and wherein the doped tin oxide material further comprises antimony or zinc.

2. The method of claim 1, wherein the precursor solution consists of water and wherein the doped tin oxide material comprises stand-alone tin oxide particles doped with antimony or zinc.

3. The method of claim 2, wherein the stand-alone tin oxide particles are tin oxide nanoparticles or tin oxide microparticles.

4. The stand-alone tin oxide particles doped with antimony or zinc prepared by the method of claim 2.

5. The method of claim 1, wherein the precursor solution comprises core-shell particles and wherein the doped tin oxide material comprises tin oxide shells doped with antimony or zinc.

6. The tin oxide shells doped with antimony or zinc prepared by the method of claim 5.

7. The method of claim 1, wherein the core-shell particles are plasmonic core-shell particles.

8. The method of claim 1, wherein the antimonate salt is sodium antimonate.

9. The method of claim 1, wherein the zinc salt comprises a mixture of zinc nitrate and sodium hydroxide.

10. The method of claim 1, wherein the doping solution comprises sodium antimonate and wherein the doped tin oxide nanomaterial comprises antimony.

11. The method of claim 1, wherein the doping solution comprises a mixture of zinc nitrate and sodium hydroxide and wherein the doped tin oxide nanomaterial comprises zinc.

12. A doped tin oxide shell particle comprising:
   a hollow plasmonic nanoshell forming an inner hollow plasmonic core; and
   doped tin oxide deposited on the inner hollow plasmonic core to form a doped tin oxide nanoshell.

13. The doped tin oxide shell particle of claim 12, wherein the hollow plasmonic nanoshell is a hollow gold-silver nanoshell.

14. The doped tin oxide shell particle of claim 12, wherein the doped tin oxide comprises antimony or zinc.

15. A method for preparing doped tin oxide material, comprising:
   preparing a precursor solution, wherein the precursor solution consists of water, or wherein the precursor solution comprises core particles, wherein the core particles are hollow gold-silver nanoshells and wherein the core particles are plasmonic;
   heating the precursor solution to at least 60° C.;
   adding a sodium stannate solution to the precursor solution to form a mixture comprising tin oxide material;
   preparing a doping solution, wherein the doping solution comprises an antimonate salt or a zinc salt;
   adding a specific amount of the doping solution to the mixture comprising tin oxide material to form a reaction mixture;
   heating the reaction mixture to at least 150° C. for a period of time; and
   collecting doped tin oxide material from the reaction mixture, wherein the doped tin oxide material comprises tin oxide shells doped with antimony or zinc.

16. The tin oxide shells doped with antimony or zinc prepared by the method of claim 15.

* * * * *

UNITED STATES PATENT AND TRADEMARK OFFICE
CERTIFICATE OF CORRECTION

PATENT NO. : 12,168,612 B2  
APPLICATION NO. : 17/425783  
DATED : December 17, 2024  
INVENTOR(S) : T. Randall Lee et al.

Page 1 of 1

It is certified that error appears in the above-identified patent and that said Letters Patent is hereby corrected as shown below:

In the Specification

1. In Column 1, Line 32, delete "nano scale" and insert -- nanoscale --, therefor.

2. In Column 11, Line 21, delete "20" and insert -- 2θ --, therefor.

3. In Column 11, Line 59, delete "is" and insert -- 1s --, therefor.

Signed and Sealed this  
Eleventh Day of February, 2025

Coke Morgan Stewart  
*Acting Director of the United States Patent and Trademark Office*